United States Patent
Brown

(10) Patent No.: US 12,500,133 B2
(45) Date of Patent: Dec. 16, 2025

(54) STRUCTURE, SYSTEM AND METHOD FOR A TEMPERATURE REGULATED ELECTRICAL DEVICE

(71) Applicant: Fluke Corporation, Everett, WA (US)

(72) Inventor: Timothy Byron Brown, Everett, WA (US)

(73) Assignee: Fluke Corporation, Everett, WA (US)

( * ) Notice: Subject to any disclaimer, the term of this patent is extended or adjusted under 35 U.S.C. 154(b) by 464 days.

(21) Appl. No.: 17/711,460

(22) Filed: Apr. 1, 2022

(65) Prior Publication Data
US 2023/0317543 A1 Oct. 5, 2023

(51) Int. Cl.
| H01L 23/34 | (2006.01) |
| H01L 21/48 | (2006.01) |
| H01L 23/367 | (2006.01) |
| H01L 23/498 | (2006.01) |

(52) U.S. Cl.
CPC ........ *H01L 23/345* (2013.01); *H01L 21/4846* (2013.01); *H01L 23/3675* (2013.01); *H01L 23/49838* (2013.01)

(58) Field of Classification Search
None
See application file for complete search history.

(56) References Cited

U.S. PATENT DOCUMENTS

| 4,902,377 | A | 2/1990 | Berglund et al. |
| 5,043,796 | A | 8/1991 | Lester |
| 5,065,124 | A | 11/1991 | Chrzan |
| 6,182,358 | B1 | 2/2001 | Schulz-Harder |
| 9,607,913 | B1 | 3/2017 | Britz |
| 2008/0178674 | A1 | 7/2008 | Walmsley |
| 2009/0051446 | A1 | 2/2009 | McCracken |
| 2009/0085191 | A1 | 4/2009 | Najafi et al. |
| 2010/0180681 | A1 | 7/2010 | Dwyer |
| 2013/0307147 | A1* | 11/2013 | Liu ........................ B81B 7/0061 257/737 |

FOREIGN PATENT DOCUMENTS

| CN | 201327596 | * 10/2009 |
| DE | 39 41 814 A1 | 6/1991 |
| DE | 41 30 925 A1 | 3/1993 |
| DE | 43 18 463 A1 | 12/1994 |
| DE | 43 40 583 A1 | 6/1995 |
| EP | 0 751 569 A2 | 1/1997 |
| EP | 0 915 515 A2 | 5/1999 |
| JP | 58-17664 A | 2/1983 |

OTHER PUBLICATIONS

International Search Report and Written Opinion, mailed Jul. 4, 2023, for International Patent Application No. PCT/US2023/017323. (16 pages).

* cited by examiner

*Primary Examiner* — Bo B Jang
(74) *Attorney, Agent, or Firm* — Seed Intellectual Property Law Group LLP

(57) ABSTRACT

A structure includes a first substrate and a second substrate. The second substrate includes a device region, and a peripheral region that laterally surrounds the device region. An insulating layer is between the first substrate and the second substrate. An opening laterally surrounds the device region and separates the device region from the peripheral region. The opening extends into the second substrate. An electrical device is in the device region, and a conductive track is in electrical communication with the electrical device. The conductive track is positioned in the opening and the peripheral region.

21 Claims, 18 Drawing Sheets

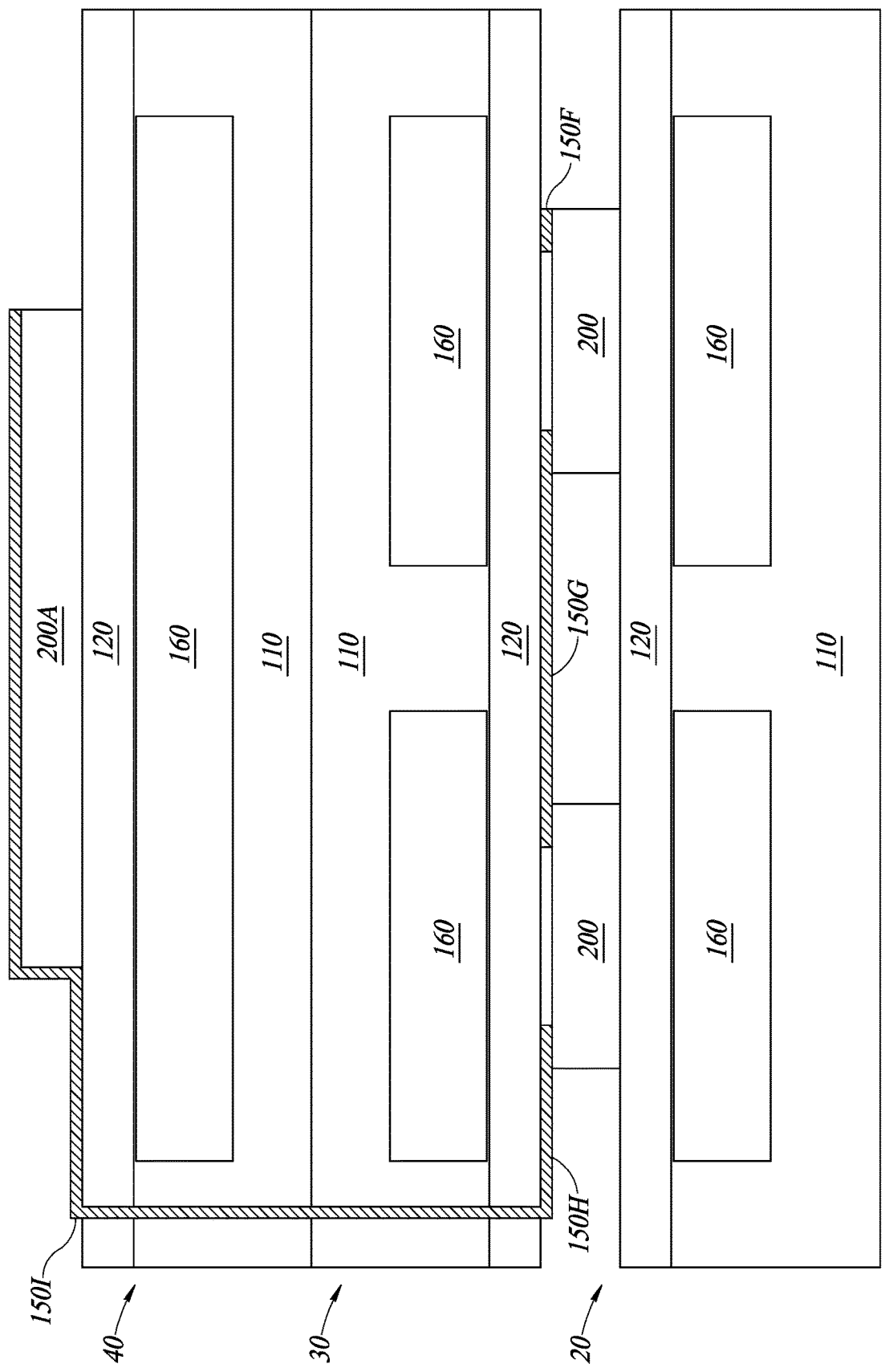

STRUCTURE, SYSTEM AND METHOD FOR A TEMPERATURE REGULATED ELECTRICAL DEVICE

BACKGROUND

Technical Field

The present disclosure is directed to structures for providing a temperature regulated electrical device or circuit, and methods of fabricating the same.

Description of the Related Art

Many precision integrated circuits benefit from operating at a stabilized temperature. Coupling a precision integrated circuit to a heater may compensate for heat loss. For example, a heater may generate heat and compensate for any heat dissipated from the precision integrated circuit to adjacent structures.

Heating of integrated circuits may be accomplished by hybrid thick film heaters with alumina substrates and discrete heater resistors on epoxy-glass PCB material. Such methods, however, typically consume large amounts of power. For example, hybrid thick film heaters with alumina substrates and discrete heater resistors on epoxy-glass PCB material may consume anywhere from 100 milliwatts to a few watts of power.

Accordingly, integrated circuits that require such heaters are generally limited in application to products with access to mains power, and are not suitable for portable devices with limited power sources, e.g., batteries. Thus, it is desirable to have a low power solution for temperature regulation of precision integrated circuits.

BRIEF SUMMARY

The present disclosure provides a structure for precision electrical devices and circuits. The structure provides a temperature controlled environment having reduced correlation to external environmental conditions. The structure is formed using commonly available materials and processes.

The structure disclosed herein results in a low power solution for temperature regulation with improved manufacturability. Improving the manufacturability of the precision electrical devices improves yield, reliability and lifespan of the precision electrical devices.

BRIEF DESCRIPTION OF THE SEVERAL VIEWS OF THE DRAWINGS

FIG. 2B is a cross-sectional view of a stacked structure in accordance with various embodiments disclosed herein.

DETAILED DESCRIPTION

Figure 1A:
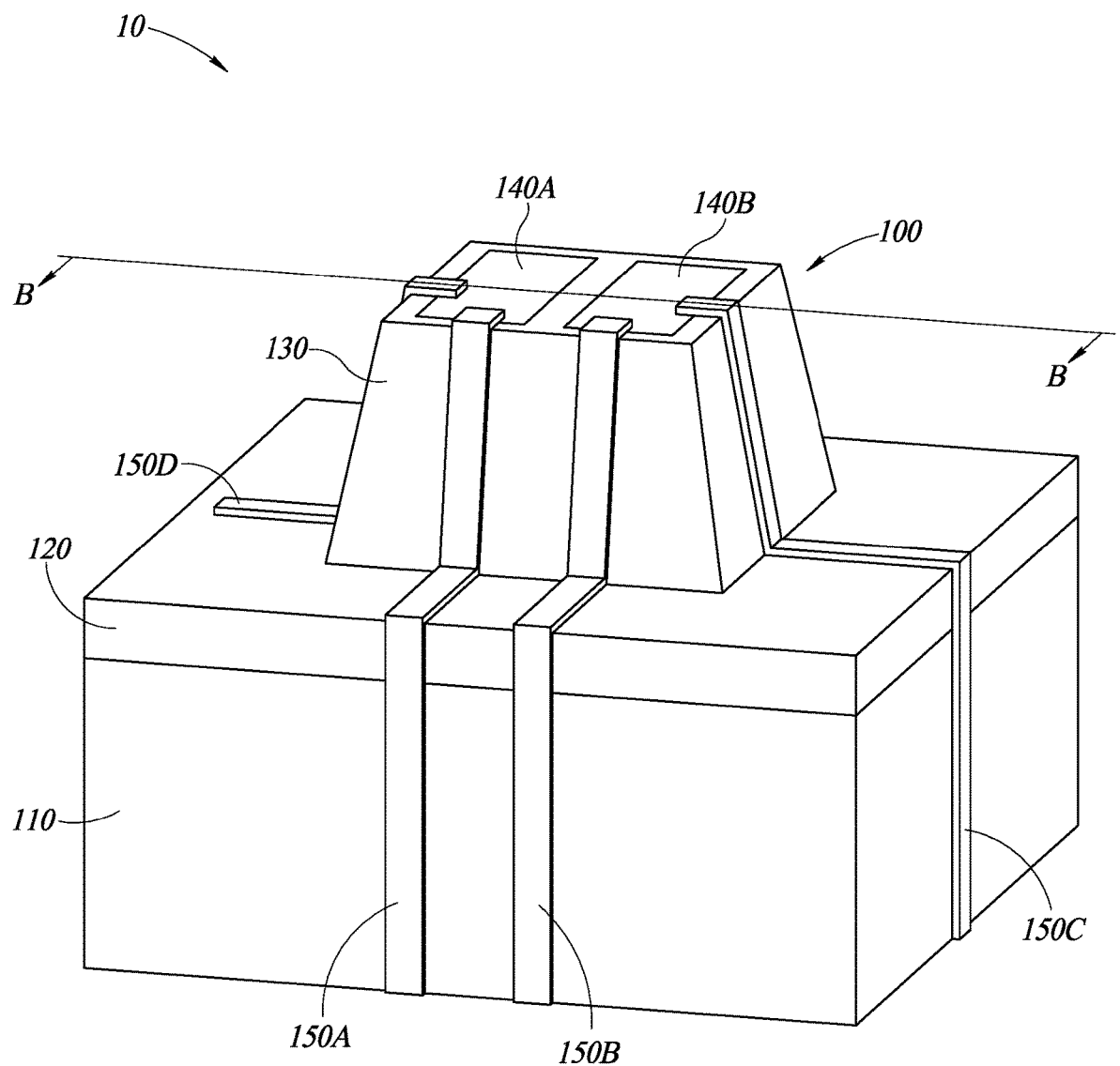
FIGS. 1A-1G are views illustrating structures in accordance with various embodiments disclosed herein.

Precision integrated circuits benefit from operating at a stabilized temperature. Embodiments of the disclosure provide improved, stable thermal control of an electrical device, using commonly available materials and processes while reducing thermal mass and thermal losses, and requiring less power. For example, a structure described herein may be free of a frame, include a void beneath an insulating layer on which an electric device is positioned, include an opening around the device while leaving a portion of the surrounding device layer material in contact with an outer frame, fill the opening with thermally/electrically insulating material for simpler contact routing, include thermal control and compensation in the electrical device, or a combination thereof.

In the structure, an exposed thermal isolation region may be formed around and under the electrical device and conductive tracks may be routed from the electrical device to endpoints in the thermal isolation region. As such, wet etch may be used to form the opening instead of forming bridging structures using complex processes. In one embodiment, a cavity silicon-on-insulator (CSOI) wafer is used, which improves thermal decoupling of the electrical device from the underlying substrate. In one embodiment, a portion of the device layer material may remain when forming the opening of the thermal isolation region. The remaining portion of the device layer material in the thermal isolation region provides thermal conductivity and acts as a heat sink to absorb sharp thermal differentials in the electrical device. In one embodiment, the thermal isolation region around the electrical device includes an opening that has insulating materials (e.g., thermal, electrical or both) deposited therein, which provides same-layer electrical routing of conductive traces to/from the electrical device with small or no reduction in thermal isolation. In one embodiment, thermal control and compensation circuitry are included in or near the electrical device in the device layer, which obviates or supplements a temperature controller that may be present on the outer frame. In one embodiment, multiple electrical devices are present on a single die that are thermally isolated from each other, which allows for different temperature setpoints for each electrical device while maintaining simplicity of manufacturing. In one embodiment, two or more wafers may be stacked, such that buried isolated electrical devices are formed, and access is provided to electrical devices that need trimming or external connection points.

In the following description, certain specific details are set forth in order to provide a thorough understanding of various embodiments of the disclosure. However, one skilled in the art will understand that the disclosure may be practiced without these specific details. In some instances, well-known details associated with semiconductors and integrated circuits have not been described to avoid obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

Figure 1B:
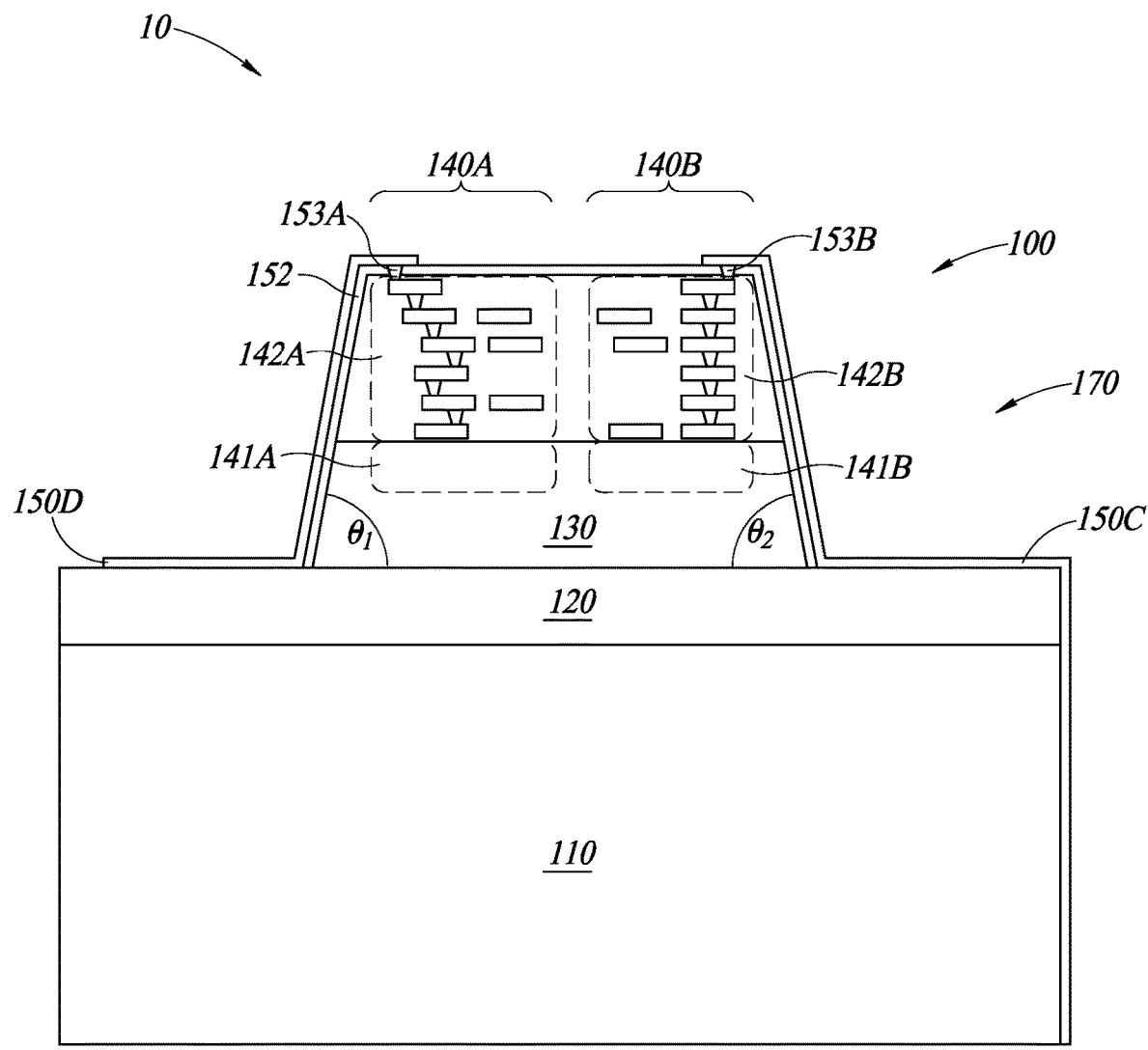

FIG. 1A is a simplified perspective view of a structure 10 according to principles described herein. FIG. 1B is a cross-sectional view of the structure 10 along the sectional line B-B shown in FIG. 1A. The structure 10 includes a first substrate 110, an insulating layer 120, a second substrate 130, integrated circuits 140A, 140B in a device region 100 of the second substrate 130, conductive tracks 150A, 150B, 150C, 150D, and an opening 170 shown as an open area that laterally surrounds the device region 100 of the second substrate 130 where the integrated circuits 140A, 140B are located.

The first substrate 110 provides a support structure for supporting the insulating layer 120 and the second substrate 130 where the integrated circuits 140A, 140B are positioned. The first substrate 110 may be or include one or more semiconductive materials, such as silicon, germanium, gallium, indium, compounds thereof, alloys thereof, or other suitable semiconductive materials. The first substrate 110 may be or include one or more of alumina, silicon carbide, or the like.

The insulating layer 120 may be a dielectric layer. In at least one embodiment, the insulating layer 120 includes an oxide of the semiconductive material of the first substrate 110. For example, in embodiments in which the first substrate 110 is silicon, the insulating layer 120 may be silicon dioxide. The insulating layer 120 may be a buried oxide (BOX) layer formed during fabrication of a wafer including the first substrate 110, the insulating layer 120, and the second substrate 130.

The second substrate 130 provides a material layer in and/or on which electrical devices, such as transistors and passive components, may be formed or otherwise positioned, e.g., within the integrated circuits 140A, 140B. The second substrate 130 may also be referred to as a device layer. The second substrate 130 may be or include the same material or substantially the same material as the first substrate 110. In some embodiments, the second substrate 130 may include an alumina substrate, silicon, aluminum nitride, or the like. In at least one embodiment, the first substrate 110, the insulating layer 120 and the second substrate 130 are collectively a silicon-on-insulator (SOI) wafer. The second substrate 130 may be in contact with an upper surface of the insulating layer 120, and the first substrate 110 may be in contact with a lower surface of the insulating layer 120. Sidewalls of the second substrate 130 are tapered or angled relative to vertical (e.g., the direction normal to a major surface of the insulating layer 120).

As shown in FIG. 1B, a first taper angle $\theta 1$ is between a first sidewall of the second substrate 130 and the upper surface of the insulating layer 120. A second taper angle $\theta 2$ is between a second sidewall of the second substrate 130 and the upper surface of the insulating layer 120. If the first taper angle $\theta 1$ and the second taper angle $\theta 2$ were 90 degrees, the first and second sidewalls would be vertical. However, in some embodiments, the first and second taper angles $\theta 1$, $\theta 2$ are less than 90 degrees, and may be less than 89 degrees, less than 85 degrees, less than 80 degrees, less than 75 degrees, less than 70 degrees, or another appropriate dimension. The first and second taper angles $\theta 1$, $\theta 2$ may be the same, substantially the same, or different. The first and second taper angles $\theta 1$, $\theta 2$ being less than about 85 degrees may result from removing the material of the second substrate 130 by a wet etching operation, and may also be beneficial to formation of the conductive tracks 150A-150D, as deposition of conductive material onto a tapered surface may be more uniform than deposition of the conductive material onto a vertical surface.

As shown in FIG. 1A, an area of a device region 100 of the second substrate 130 in contact with the upper surface of the insulating layer 120 may be less than an area of the first substrate 110 in contact with the lower surface of the insulating layer 120. The device region 100 may be a remaining portion of the second substrate 130 following an etch operation (e.g., a wet etching operation) that removes material of the second substrate 130 other than the device region 100. As shown in FIG. 1A, the material of the second substrate 130 may be removed up to edges of the insulating layer 120, thus creating an opening 170 that laterally surrounds the device region 100. The opening 170 may be referred to as an isolation region.

In the illustrated embodiment, one or more integrated circuits 140A, 140B are formed or otherwise positioned in the second substrate 130, on the second substrate 130, or both. The integrated circuit 140A is offset from the integrated circuit 140B. One or more of the integrated circuits 140A, 140B are operated at a selected temperature (e.g., ovenized). For example, a heater may be used to elevate the temperature of the integrated circuits 140A, 140B, or electrical devices forming portions thereof, which maintains the temperature above a normal operating temperature, possibly by several degrees. In at least one embodiment, the selected temperature is controlled to maintain a high temperature setpoint, so that the temperature regulated electrical device cools quickly, enabling simplified temperature control.

The selected temperature may be selected using thermal control and compensation circuitry. For example, the thermal control and compensation circuitry, in operation, may adjust the temperature of one or more electrical devices (e.g., a transistor) of the integrated circuit 140A in response to a temperature-dependent electrical characteristic of the electrical device. The thermal control and compensation circuitry is arranged on the second substrate 130, in the second substrate 130, or both. The thermal control and compensation circuitry may be positioned in the integrated circuits 140A, 140B, respectively, or may be positioned in a region of the second substrate 130 outside of the integrated circuits 140A, 140B, such as a region between the integrated circuits 140A, 140B. The thermal control and compensation circuitry is described in greater detail with reference to FIG. 1H.

As shown in FIG. 1B, the integrated circuits 140A, 140B may include electrical devices 141A, 141B, respectively, which may include transistors, integrated passive components (e.g., resistors, capacitors and inductors), diodes, and the like. The integrated circuits 140A, 140B may include interconnect structures 142A, 142B, respectively. The interconnect structures 142A, 142B may include traces and vias, and may include transistors, capacitors, inductors, or the like. In some embodiments, the interconnect structures 142A, 142B are not present.

As shown in FIG. 1A, the conductive tracks 150A, 150B, 150C, 150D provide electrical interconnection between the integrated circuits 140A, 140B and other devices. The conductive tracks 150A-150D are positioned in the opening 170. It should be understood that the conductive tracks 150A-150D are positioned "in" the opening 170 according to multiple configurations described herein. For example, as illustrated in FIG. 1A, the conductive tracks 150A-150D extend laterally from the integrated circuits 140A, 140B, onto sidewalls of the second substrate 130 exposed by the opening 170, and onto the upper surface of the insulating layer 120. Similarly, in FIG. 1E, in which the opening 170 is a trench (e.g., having two lateral sidewalls), the conductive tracks 150C, 150D are illustrated as extending laterally from the integrated circuits 140A, 140B onto the sidewalls of the device region 100 of the second substrate 130, and onto an upper surface 130S of the second substrate 130 exposed by the opening 170. In FIG. 1G, the conductive tracks 150C, 150D extend laterally from the integrated circuits 140A, 140B, and traverse the opening 170 to a peripheral region 130P of the second substrate 130. In FIG. 1G, although the conductive tracks 150C, 150D do not dip vertically downward into the opening 170, the conductive tracks 150C, 150D overlap and traverse the opening 170 in the top view cross-section defined by the opening 170 (see FIG. 1F), which also is considered as being "in" the opening 170.

The conductive track 150A is electrically connected to the integrated circuit 140A and runs over the upper surface of the second substrate 130, over the first sidewall of the second substrate 130, over the upper surface of the insulating layer 120, over a first sidewall of the insulating layer 120 and over a first sidewall of the first substrate 110. In some embodiments, the upper surface of the insulating layer 120 is exposed. In some embodiments, the conductive track 150A is in contact with the upper surface of the insulating layer 120. The conductive track 150A may have a shape that conforms to surfaces of the second substrate 130, the insulating layer 120, and the first substrate 110 on which the conductive track 150A is positioned. The conductive track 150B is similar in many respects to the conductive track 150A, other than the conductive track 150B is electrically connected to the integrated circuit 140B instead of to the integrated circuit 140A.

The conductive tracks 150C, 150D are illustrated in cross-sectional side view in FIG. 1B. The conductive track 150C is electrically connected to the integrated circuit 140B. In some embodiments, the conductive track 150C is electrically connected to the integrated circuit 140B by a pad or via 153B. The pad 153B may be in contact with the interconnect structure 142B and the conductive track 150C.

In some embodiments, the pad 153B extends through a passivation layer 152. The passivation layer 152 may be a dielectric layer. For example, the passivation layer 152 may be an oxide layer that includes an oxide of the material of the second substrate 130, such as an oxide of silicon, or may be another dielectric, such as silicon nitride. The passivation layer 152 may be a polymer, such as a polyimide, polybenzoxaxole, benzocyclobutene, or the like. The passivation layer 152, when present, may cover the upper surface of the integrated circuits 140A, 140B and sidewalls of the second substrate 130. The conductive track 150C may contact an upper surface of the pad 153B exposed by an opening in the passivation layer 152. The conductive track 150C may contact the passivation layer 152 at sidewalls of the second substrate 130. As such, the conductive track 150C may be separated from the sidewalls of the second substrate 130 by the passivation layer 152.

The conductive track 150D is similar in many respects to the conductive tracks 150A-150C, other than the conductive track 150D terminates on the upper surface of the insulating layer 120 instead of on a sidewall of the first substrate 110.

Figure 1C:
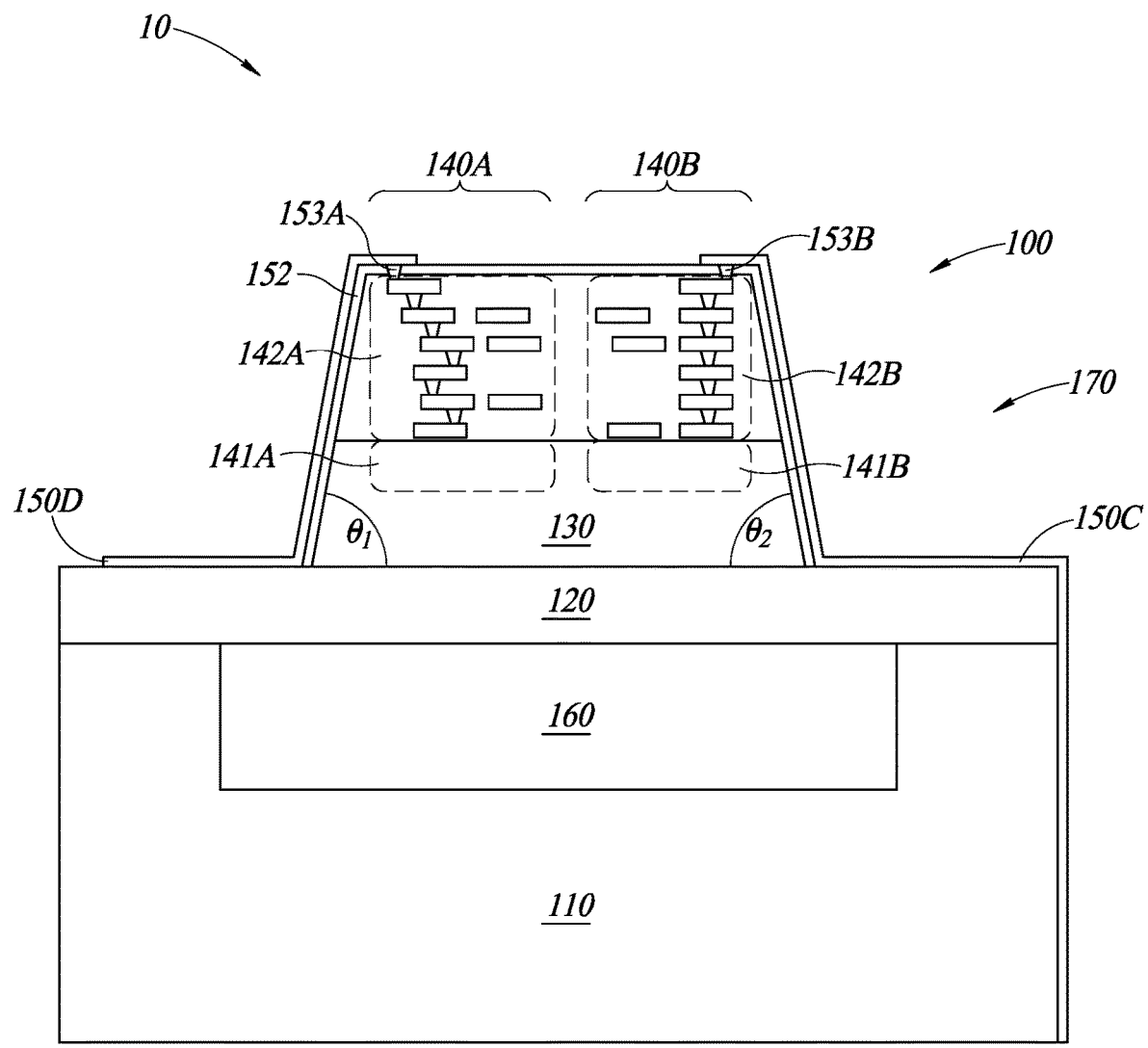
Figure 1D:
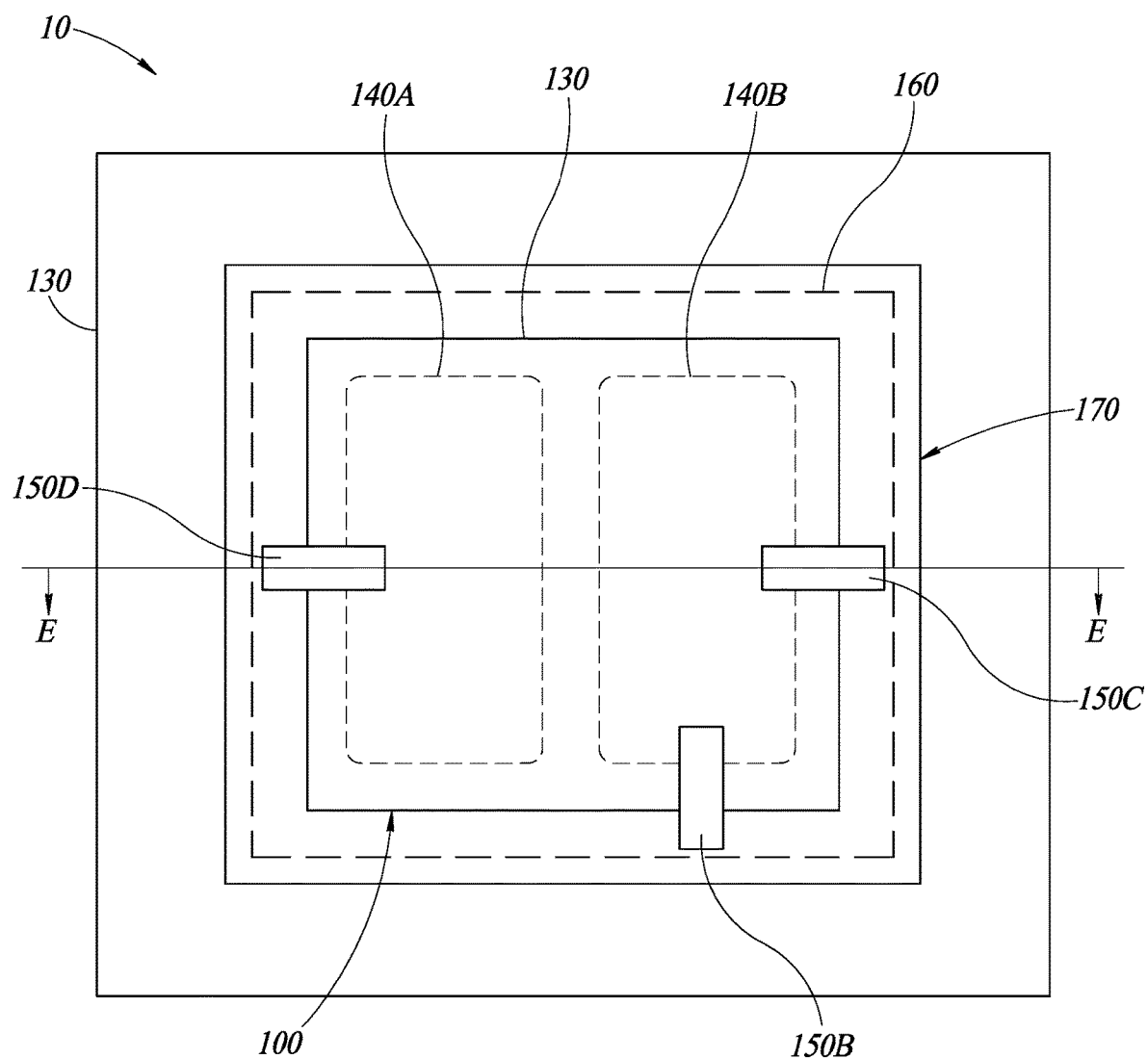

FIG. 1C illustrates the structure 10 according to another embodiment. In the structure 10 shown in FIG. 1C, a cavity 160 is present between at least a portion of the first substrate 110 and the insulating layer 120. The first substrate 110, the insulating layer 120, the second substrate 130 and the cavity 160 may be referred to collectively as a cavity silicon-on-insulator (CSOI) substrate. An area of the cavity 160 in horizontal cross-section (e.g., into the page) may be larger than the area of the device region 100. In some embodiments, in a top-view, the device region 100 does not extend outside the cavity 160, for example, as illustrated in FIG. 1D. As such, the thermal decoupling of the integrated circuits 140A, 140B from the underlying first substrate 110 may be increased by the presence of the cavity 160. The cavity 160 may contain air or another gas, or may be substantially free of gases (e.g., in a vacuum state).

Figure 1E:
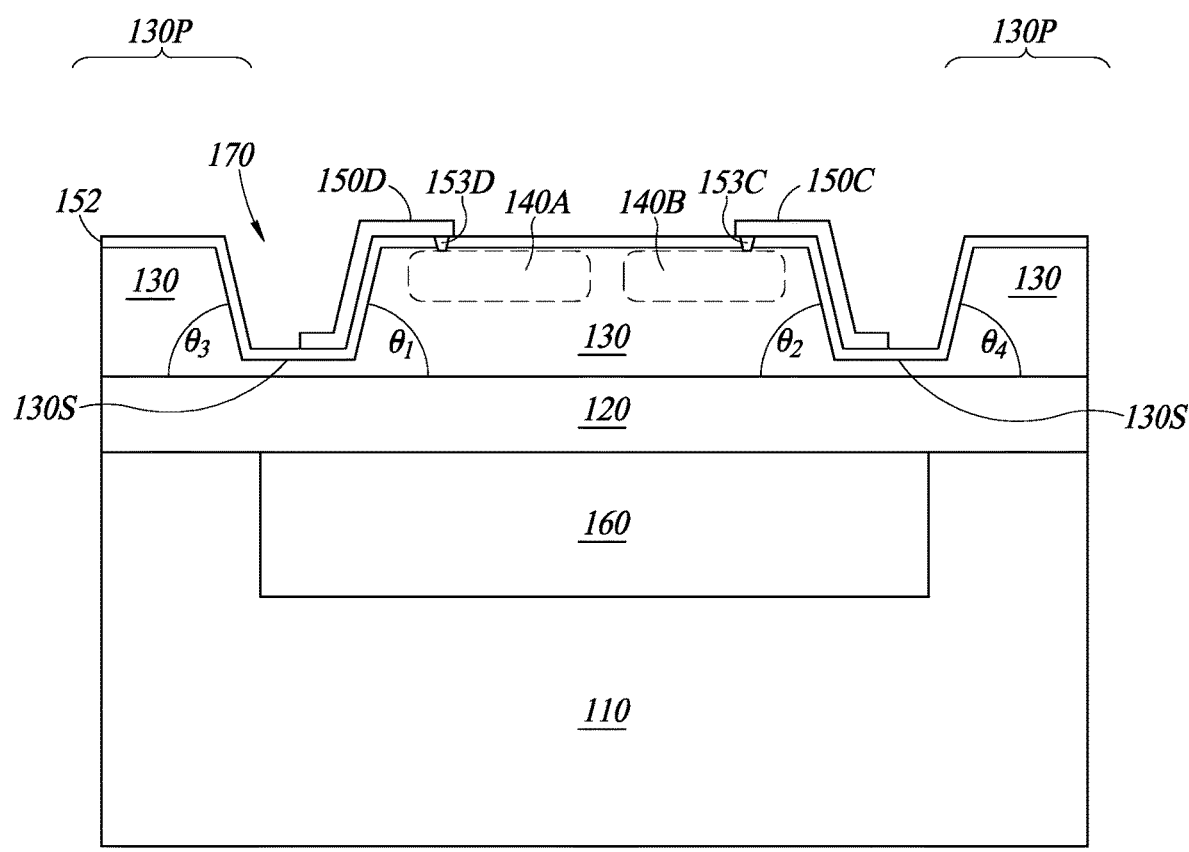

FIGS. 1D and 1E illustrate various embodiments of the structure 10 in which the opening 170 is a trench defined in the second substrate 130 and laterally surrounding the device region 100. FIG. 1E is a cross-sectional side view of the structure 10 of FIG. 1D along line E-E of FIG. 1D.

As shown in FIG. 1D, the opening 170 laterally surrounds the device region 100 and extends partially toward outer edges of the second substrate 130. A peripheral region 130P of the second substrate 130 laterally surrounds the opening 170. In some embodiments, the opening 170 extends laterally beyond edges of the cavity 160 in the top view.

As shown in FIG. 1E, the opening 170 may extend vertically into the second substrate 130. In some embodiments, similar to FIG. 1B, the opening 170 exposes the insulating layer 120. In some embodiments, as illustrated in FIG. 1E, the opening 170 may extend partially into the second substrate 130 without exposing the insulating layer 120, such that the opening 170 is vertically separated from the insulating layer 120 by a portion of the second substrate 130. Remaining material of the second substrate 130 underlying the opening 170 provides thermal conductivity and acts as a heat sink to absorb thermal differentials in the structure 10.

The peripheral region 130P may include outer sidewalls and inner sidewalls. The outer sidewalls may be vertical or substantially vertical, and may be coplanar with or substantially coplanar with the sidewalls of the first substrate 110 and the sidewalls of the insulating layer 120. The inner sidewalls of the peripheral region 130P may be tapered or angled, as shown in FIG. 1E. A third taper angle θ3 may be between a first sidewall of the peripheral region 130P and the upper surface of the insulating layer 120. A fourth taper angle θ4 may be between a second sidewall of the peripheral region 130P and the upper surface of the insulating layer 120. One or more of the first, second, third, and fourth taper angles θ1, θ2, θ3, θ4 may be the same as, substantially the same as, or different from others of the first, second, third, and fourth taper angles θ1, θ2, θ3, θ4. The first, second, third, and fourth taper angles θ1, θ2, θ3, θ4 may be beneficial for improving uniformity of conductive material deposited on the tapered sidewalls of the second substrate 130 when forming the conductive traces 150A-150D.

In some embodiments, as shown in FIG. 1E, the passivation layer 152 may extend to outer edges of the peripheral region 130P, and may cover upper surfaces 130S and sidewalls of the second substrate 130 within the opening 170 and upper surfaces of the peripheral region 130P of the second substrate 130. In embodiments in which the opening 170 exposes the insulating layer 120, the insulating layer 120 may be substantially free of the passivation layer 152, and the passivation layer 152 may cover the device region 100 and the peripheral region 130P of the second substrate 130.

FIG. 1E shows the cavity 160. In some embodiments, the cavity 160 is not present when the peripheral region 130P is present.

Figure 1F:
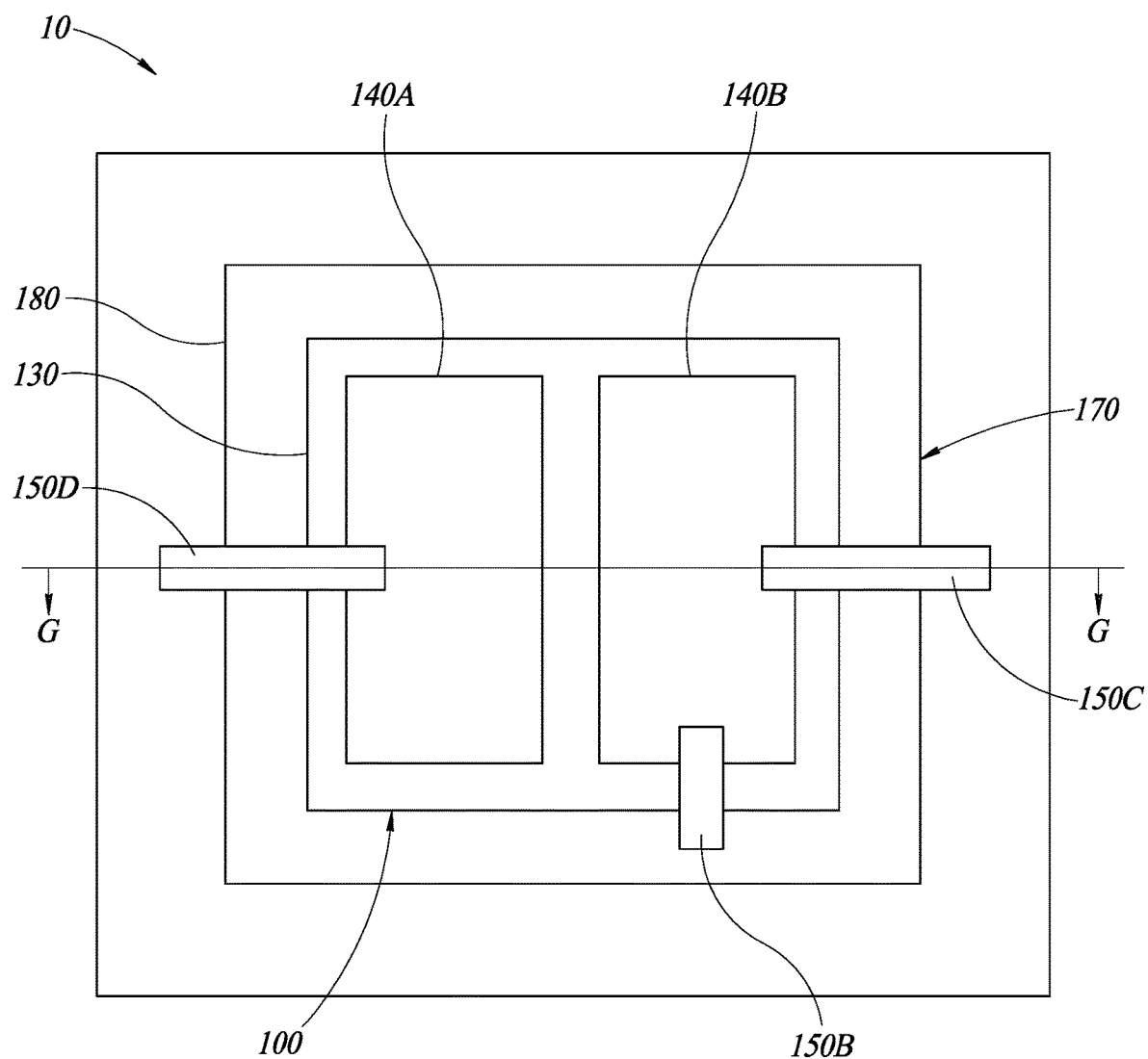
Figure 1G:
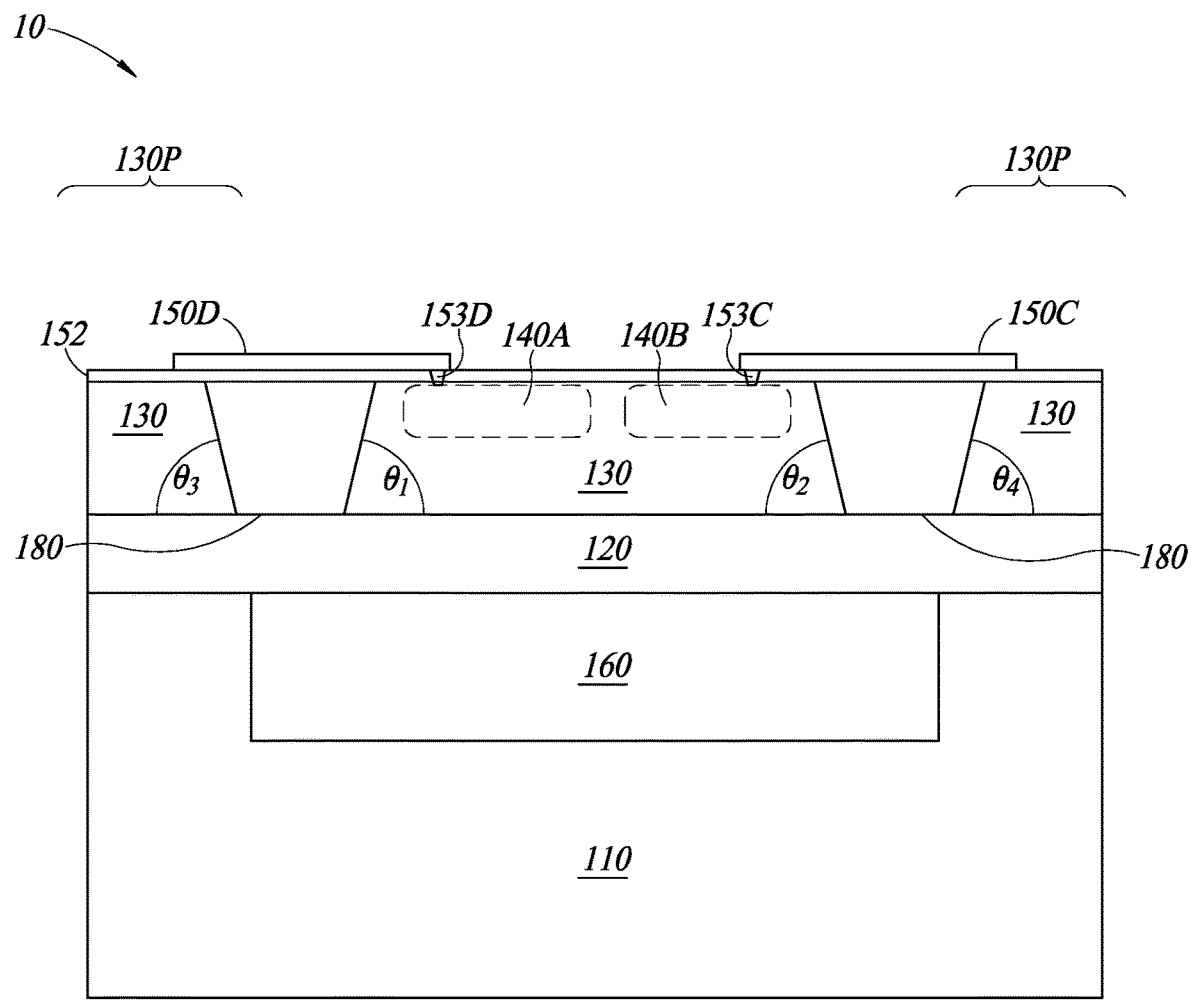

FIGS. 1F and 1G illustrate the structure 10 including a thermally insulating material layer or an electrically insulating material layer in the opening 170 in accordance with various embodiments. FIG. 1G is a cross-sectional side view of the structure 10 taken along the line G-G shown in FIG. 1F.

In some embodiments, the structure 10 includes an insulating material layer 180 in the opening 170. The insulating material layer 180 may include one or more materials that are thermally insulating, electrically insulating, or both. The material of the insulating material layer 180 may include polysilicon, polyimide, silicon dioxide, combinations thereof, or the like. The insulating material layer 180 and the opening 170 may be collectively referred to as an isolation region. The isolation region laterally surrounds the device region 100 of the second substrate 130, including the integrated circuits 140A, 140B. Thermal isolation provided by the material of the insulating material layer 180 may be less than that of air. Inclusion of the insulating material layer 180 maintains beneficial thermal isolation while allowing for same-layer routing of the conductive traces 150A-150D to and from the integrated circuits 140A, 140B. As shown in FIG. 1G, upper surfaces of the device region 100, the peripheral region 130P, and the insulating material layer 180 are coplanar or substantially coplanar, such that the conductive traces 150C, 150D have a uniform level crossing over the opening 170. In some embodiments, the passivation layer 152 is present on the insulating material layer 180. In some embodiments, the passivation layer 152 is not present on the insulating material layer 180, such that the conductive traces 150C, 150D are in contact with the insulating material layer 180. When the conductive traces 150C, 150D are in contact with the insulating material layer 180, the upper surfaces of the passivation layer 152 and the insulating material layer 180 may be coplanar or substantially coplanar.

Figure 1H:
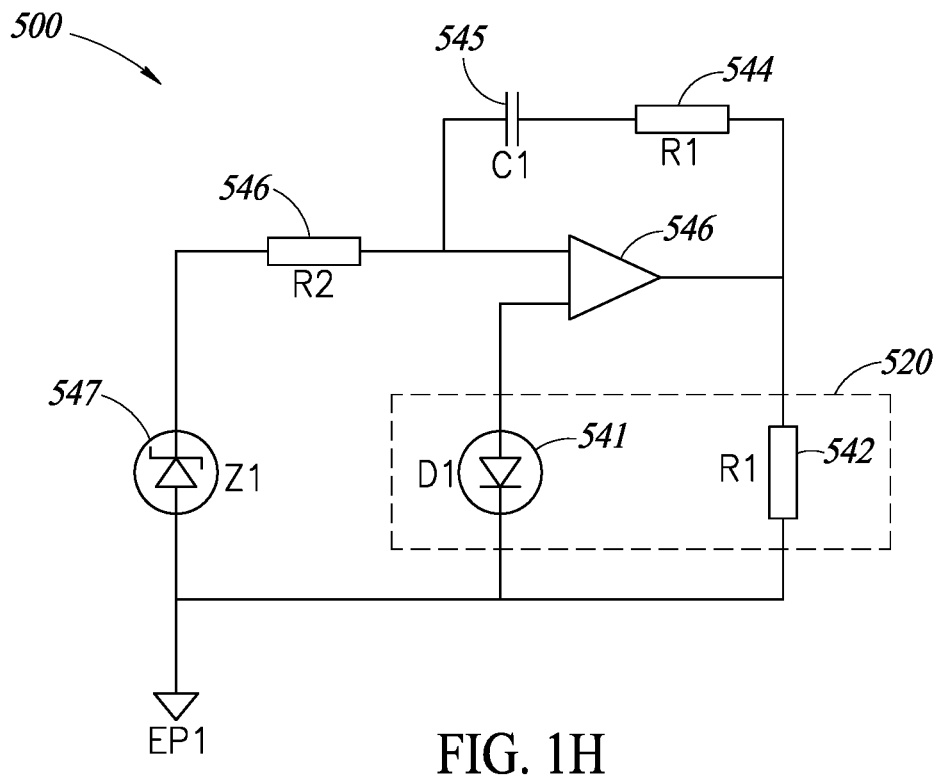
FIG. 1H is a schematic diagram of active thermal control and compensation circuitry in accordance with various embodiments disclosed herein.

FIG. 1H is a diagram illustrating active thermal control and compensation circuitry 500 in accordance with various embodiments. The active thermal control and compensation circuitry 500 includes a heating element 542, a sensing element 541, and an amplifier 548 electrically connected to the heating element 542 and the sensing element 541. The active thermal control and compensation circuitry 500 further includes a first resistor 544, a second resistor 546, a capacitor 545, and a diode 547.

The heating element 542 and the sensing element 541 may be positioned in a thermally isolated region 520, which may be the device region 100, in one of the integrated circuits 140A, 140B, or in another region of the device region 100. In some embodiments, the heating element 542 is a third resistor. The heating element 542 is electrically connected to an output of the amplifier 548 and to a voltage node EP1, which may be a ground node in some embodiments. Current through the heating element 542 generates heat, which adjusts a temperature of the thermally isolated region 520. In some embodiments, the heating element 542 is positioned near or adjacent to one or more electrical devices of the integrated circuit 140A or the integrated circuit 140B, such as an integrated resistor, a reference voltage source, or other electrical device, so as to balance the temperature of the electrical device at a setpoint above a normal operating temperature of the electrical device. In some embodiments, the heat generated by the heating element 542 adjusts temperature of the device region 100 or of one or more of the integrated circuits 140A, 140B.

The sensing element 541 may be a diode, and is coupled to a non-inverting input terminal of the amplifier 548 and the voltage node EP1. A voltage drop across the sensing element 541 is variable based on the temperature of the sensing element 541. As such, the sensing element 541 may be used to sense the temperature of the thermally isolated region 520 while the heat is generated by the heating element 542.

The first resistor 544 and the capacitor 545 form a negative feedback path (e.g., feedback circuitry) from the output of the amplifier 548 to an inverting input terminal of the amplifier 548. The first resistor 544 has a first terminal coupled to the output terminal of the amplifier 548, and has a second terminal coupled to a first terminal of the capacitor 545. A second terminal of the capacitor 545 is coupled to the inverting input terminal of the amplifier 548.

The second resistor 546 and the diode 547 form a path (e.g., bias circuitry) from the inverting input terminal of the amplifier 548 to the voltage node EP1. A first terminal of the second resistor 546 is coupled to the inverting input terminal of the amplifier 548, and a second terminal of the second resistor 546 is coupled to a cathode terminal of the diode 547. An anode terminal of the diode 547 is coupled to the voltage node EP1. In some embodiments, the diode 547 is a Zener diode, as shown in FIG. 1H.

The amplifier 548, in operation, adjusts electrical current in the heating element 542 in response to a temperature-dependent change in voltage across the sensing element 541. As the temperature of the thermally isolated region 520 changes, the voltage drop across the sensing element 541 changes, which alters the output of the amplifier 548 such that current flowing through the heating element 542 is changed, altering the amount of heat added to the thermally isolated region 520. The temperature of the thermally isolated region 520 of the structure 10 may be selected by selecting resistance values of the first resistor 544 and the second resistor 546, a capacitance value of the capacitor 545, and a voltage of the diode 547.

FIGS. 1I-1L are schematic diagrams of passive thermal control and compensation circuitry 600, 600A, 700, 700A in accordance with various embodiments disclosed herein. It should be understood that "passive" as compared with "active" indicates that no circuit amplification is done. For example, an operational amplifier or comparator, which are considered "active" components, is not used in the "passive" thermal control and compensation circuitry 600, 600A, 700, 700A shown in FIGS. 1I-1L, while the amplifier 548 is used in the "active" thermal control and compensation circuitry 500 shown in FIG. 1H. The passive thermal control and compensation circuitry 600, 600A, 700, 700A have advantages of simpler design and manufacture, and the active thermal control and compensation circuitry 500 has the advantage of higher efficiency.

Figure 1I:
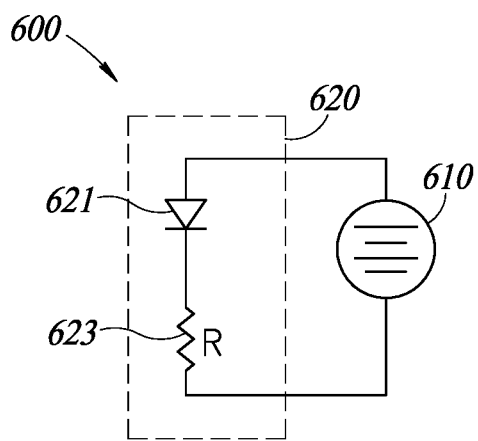
FIGS. 1I-1L are schematic diagrams of passive thermal control and compensation circuitry in accordance with various embodiments disclosed herein.

In FIG. 1I, the passive thermal control and compensation circuitry 600 includes a power supply 610 and a heater 620. The heater 620 includes a temperature sensing element such as a diode 621, and a heating element such as a resistor 623. The resistor 623 has a first terminal coupled to a first terminal of the diode 621, and second terminals of the resistor 623 and the diode 621 are coupled to either end of the power supply 610, as shown. The voltage across the diode 621 changes due to temperature, which changes a differential voltage across the resistor 623. The change in differential voltage induces a change in current flow in the resistor 623, which results in local resistive heating. For example, as temperature increases, the voltage across the diode 621 decreases and current increases, such that current through the resistor 623 increases, increasing local resistive heating.

Figure 1J:
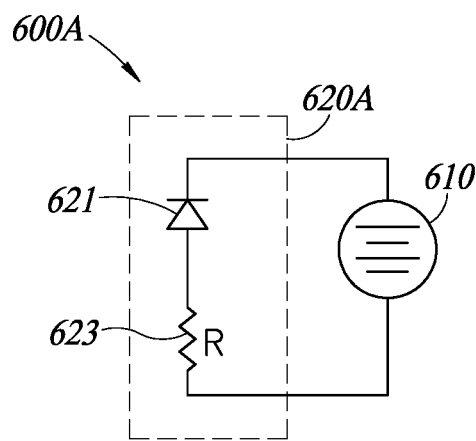

In FIG. 1J, the passive thermal control and compensation circuitry 600A is similar in many respects to the thermal control and compensation circuitry 600, but the orientation of the diode 621 in the heater 620A is reverse that of the heater 620. As temperature increases, voltage across the diode 621 of the heater 620A decreases and current increases, such that current through the resistor 623 increases, increasing local resistive heating.

Figure 1K:
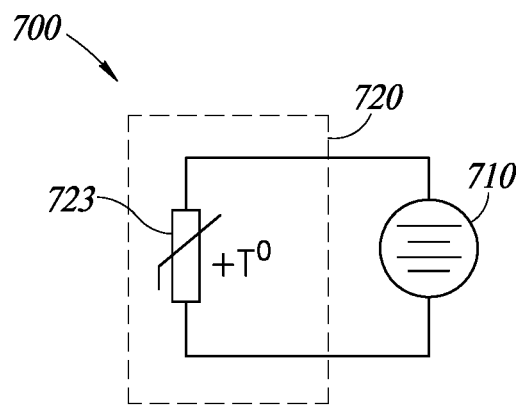

In FIG. 1K, the passive thermal control and compensation circuitry 700 includes a heater 720 coupled to a power supply 710. The heater 720 may include a thermistor 723, which may have a positive temperature coefficient of resistivity. When connected with a controlled reference voltage generated by the power supply 710, the thermistor 723 may control temperature by changing current. When the temperature increases, the resistance of the thermistor 723 increases, the current flow in the thermistor 723 decreases, and the temperature decreases. When the temperature decreases, the resistance of the thermistor 723 decreases, the current flow in the thermistor 723 increases, and the temperature increases.

Figure 1L:
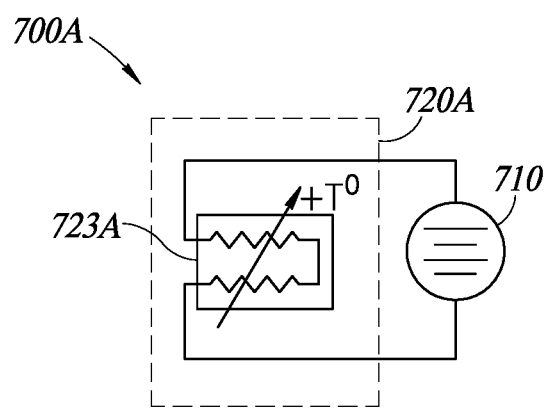

In FIG. 1L, the passive thermal control and compensation circuitry 700A includes a heater 720A, which includes a resistance temperature detector (RTD) 723A having a positive temperature coefficient of resistivity. When the temperature increases, the resistance of the RTD 723A increases, the current flow in the RTD 723A decreases, and the temperature decreases. When the temperature decreases, the resistance of the RTD 723A decreases, the current flow in the RTD 723A increases, and the temperature increases.

It should be understood that the embodiments shown in FIGS. 1I-1L may be combined in various ways. For example, the heating element 720 may include a combination of the thermistor 723 and the RTD 723A. In another example, the diode 621 may be replaced or supplemented with the thermistor 723, the RTD 723A, or both.

Figure 2A:
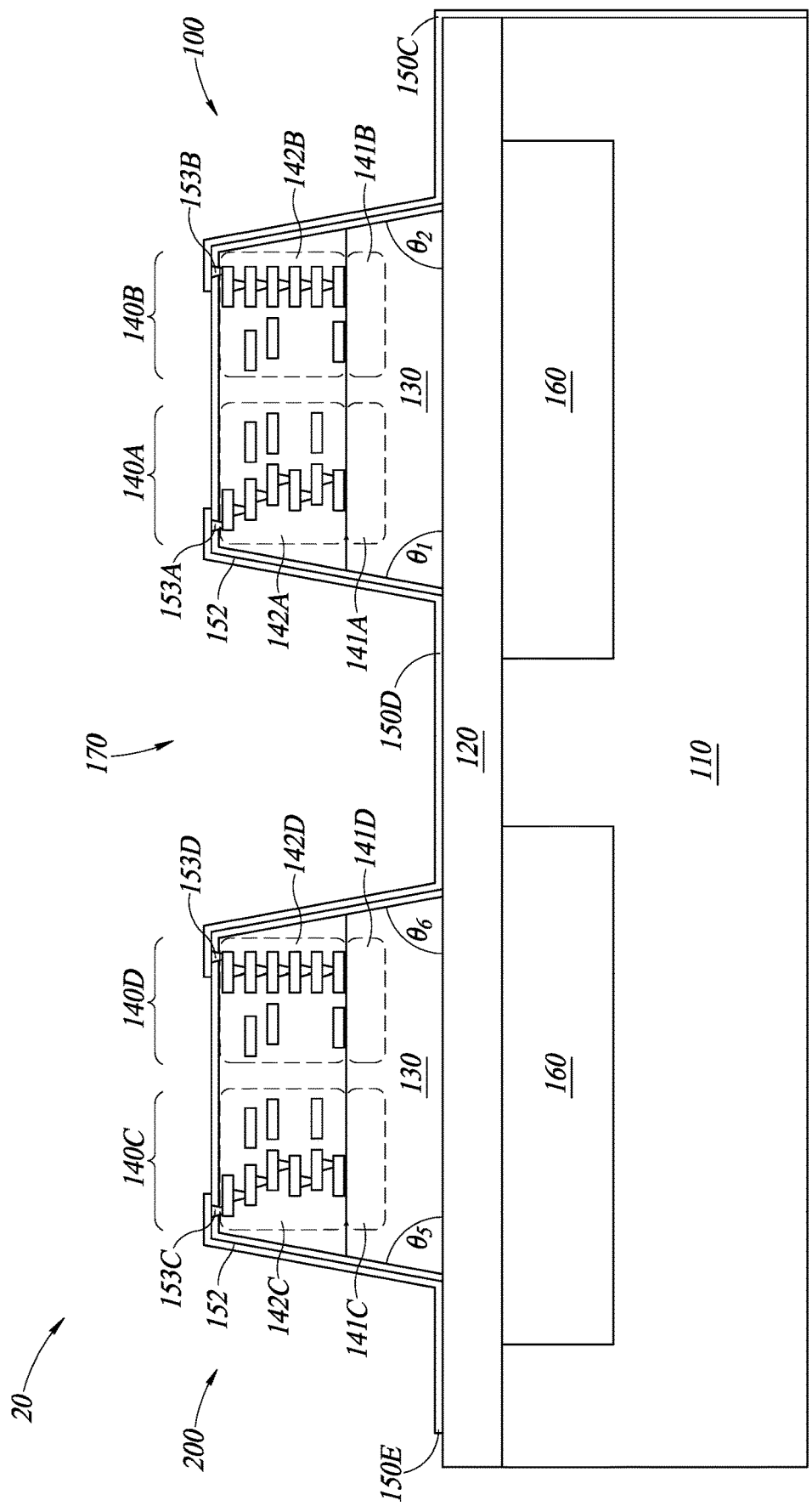
FIG. 2A is a cross-sectional view of a structure in accordance with various embodiments disclosed herein.

FIG. 2A is a diagram of a structure 20 including two or more device regions 100, 200 in accordance with various embodiments. The structure 20 includes the device region 100 and a second device region 200. The device region 100 and the second device region 200 are separated by the opening 170.

The second device region 200 is similar in many respects to the device region 100. The second device region 200 includes one or more integrated circuits 140C, 140D. The integrated circuits 140C, 140D include electrical devices 141C, 141D, respectively, and include interconnect structures 142C, 142D, respectively. The integrated circuits 140C, 140D may be the same as, similar to, or different than the integrated circuits 140A, 140B. One or more of the integrated circuits 140A-140D may be electrically connected to others of the integrated circuits 140A-140D. For example, as shown in FIG. 2A, the integrated circuit 140A is electrically connected to the integrated circuit 140D by the conductive trace 150D. A conductive trace 150E may be electrically connected to the integrated circuit 140C.

Sidewalls of the second device region 200 may be tapered or angled with respect to the upper surface of the insulating layer 120. For example, a fifth taper angle θ5 may be between a first sidewall of the second device region 200 and the insulating layer 120, and a sixth taper angle θ6 may be between a second sidewall of the second device region 200 and the insulating layer. In some embodiments, the fifth and sixth taper angles θ5, θ6 are less than 90 degrees, such as less than 89 degrees, less than 85 degrees, less than 80 degrees, less than 75 degrees, less than 70 degrees, or another appropriate dimension. One or more of the first to sixth taper angles θ1, θ2, θ3, θ4, θ5, θ6 may be the same as, substantially the same as, or different than others of the first to sixth taper angles θ1, θ2, θ3, θ4, θ5, θ6.

A cavity 160 may be present beneath the second device region 200. Details of the cavity 160 under the second device region 200 are similar to those of the cavity 160 under the device region 100, and are described above with reference to FIG. 1C.

Arranging two or more device regions onto separate insulated locations on a single die (e.g., the structure 20) allows for single wafer support for multiple isolated temperature-controlled devices (e.g., the integrated circuits 140A-140D) and capability for different temperature setpoints for different devices. For example, a first temperature setpoint may be associated with the integrated circuits 140A, 140B and a second temperature setpoint different than the first temperature setpoint may be associated with the integrated circuits 140C, 140D.

FIG. 2B is a diagram illustrating a stack of multiple structures in accordance with various embodiments. In FIG. 2B, the structure 20 is bonded to a second structure 30, which is bonded to a third structure 40. By stacking the structures 20, 30, 40, electrical devices may be buried and isolated, and access to electrical devices that need trimming or external connection points may be provided.

The third structure 40 includes a device region 200A, which may be similar in many respects to the device regions 100, 200 of the structure 20, which are described with reference to FIGS. 1A, 1B and 2A. The second structure 30 may be similar in many respects to the structure 20, but may be free of device regions. For example, the second substrate 130 may be completely removed in the second structure 30.

The second structure 30 may have conductive tracks 150F, 150G, 150H positioned thereon. The second structure 30 may be bonded to the structure 20 by direct bonding, eutectic bonding, plasma-activated bonding, surface-activated bonding, adhesive bonding, or other appropriate bonding method. For example, metal of the conductive tracks 150F-150H may be bonded to metal of the pads 153A-153D (see FIG. 2A) of the structure 20 by eutectic bonding.

The conductive track 150H may extend over the insulating layer 120 of the second structure 30, and may extend through the insulating layer 120 and the first substrate 110 of the second structure 30. A surface of the conductive track 150H may be coplanar with the lower surface of the first substrate 110 of the second structure 30, such that the surface of the conductive track 150H is exposed.

A conductive track 150I is electrically connected to the device region 200A. The conductive track 150I extends over the insulating layer 120, and extends through the insulating layer 120 and the first substrate 110 of the third structure 40. A surface of the conductive track 150I may be coplanar with the lower surface of the first substrate 110 of the third structure 40. The surface of the conductive track 150I may be aligned with the surface of the conductive track 150H. The first substrate 110 of the third structure 40 is bonded to the first substrate 110 of the second structure 30, for example, by direct bonding (e.g., silicon to silicon). The conductive track 150I may be bonded to the conductive track 150H, such that the second device region 200 is electrically connected to the device region 200A by the conductive tracks 150H, 150I.

FIGS. 3A-3K are diagrams illustrating intermediate stages in a process for forming a structure in accordance with various embodiments. FIG. 4 shows a flowchart of a process 42 which may be used to form the structures 10 shown in FIGS. 1A-1G. Description of the process shown in FIGS. 3A-3K may be given with reference to FIG. 4. It should be understood that the process 42 may be utilized to form structures different from those shown in FIGS. 3A-3K. In some embodiments, the process 42 for forming the structure includes a number of operations (400, 410, 420, 430 and 440). The process 42 for forming the structure will be further described according to one or more embodiments. It should be noted that the operations of the process 42 may be rearranged or otherwise modified within the scope of the various aspects. It should further be noted that additional processes may be provided before, during, and after the process 42, and that some other processes may be only briefly described herein. For example, operation 430 of the process 42 is optional.

Figure 3A:
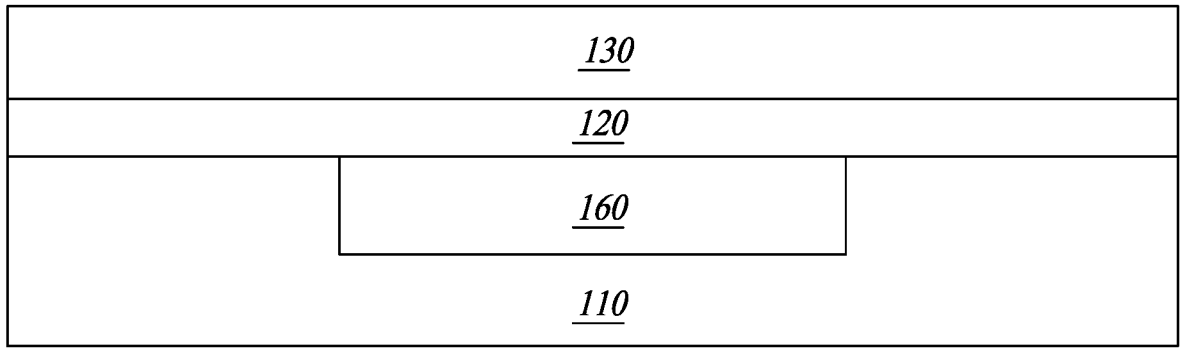
FIGS. 3A-3K are cross-sectional views illustrating a method of fabricating a structure in accordance with various embodiments disclosed herein.
Figure 4:
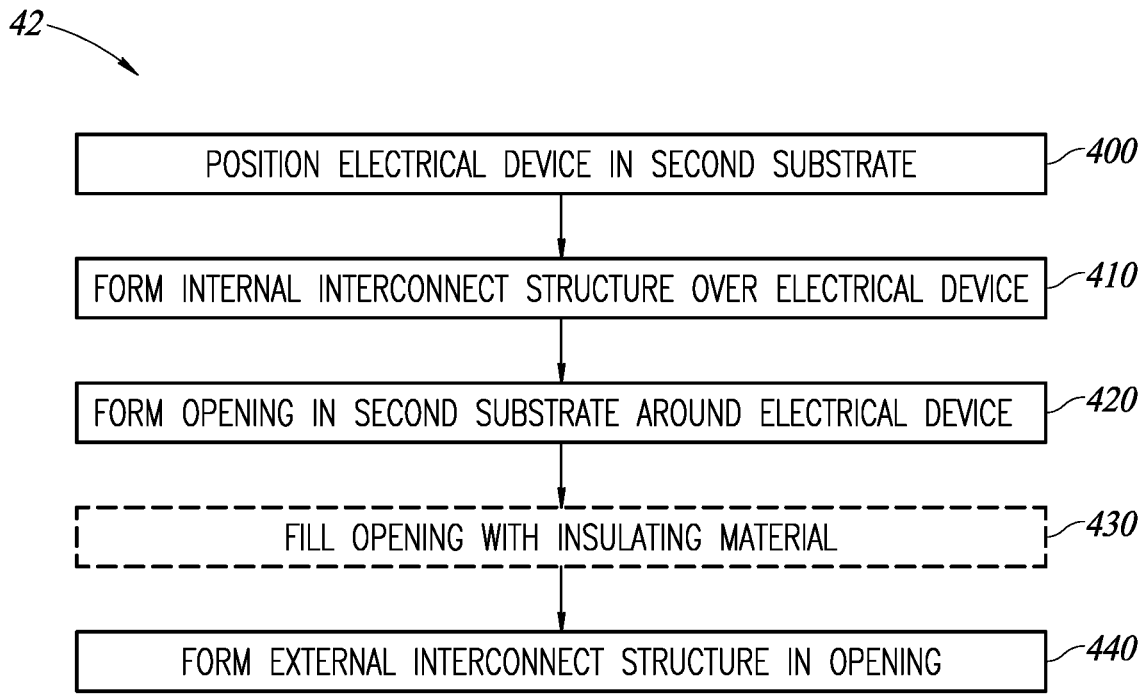
FIG. 4 is a flowchart of a method of fabricating a structure in accordance with various embodiments disclosed herein.

In FIG. 3A, a wafer is provided. The wafer may be an SOI wafer, a CSOI wafer, or other suitable wafer. The wafer includes the first substrate 110, the insulating layer 120 and the second substrate 130, and may include optional cavity 160.

Figure 3B:
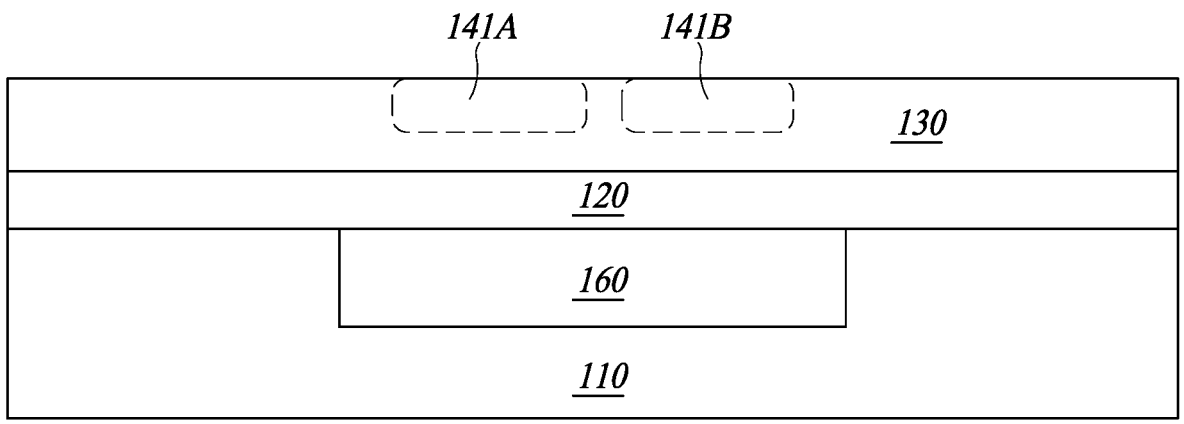

In FIG. 3B, electrical devices 141A, 141B are positioned in the second substrate 130, on the second substrate 130, or both, corresponding to operation 400 of process 42 shown in FIG. 4. Positioning the electrical devices 141A, 141B may include one or more operations, such as etching, deposition, masking, development, implantation, annealing, and other semiconductor fabrication operations. In some embodiments, positioning the electrical devices 141A, 141B includes placing the electrical devices 141A, 141B, for example, in embodiments in which the electrical devices 141A, 141B are discrete components.

Figure 3C:
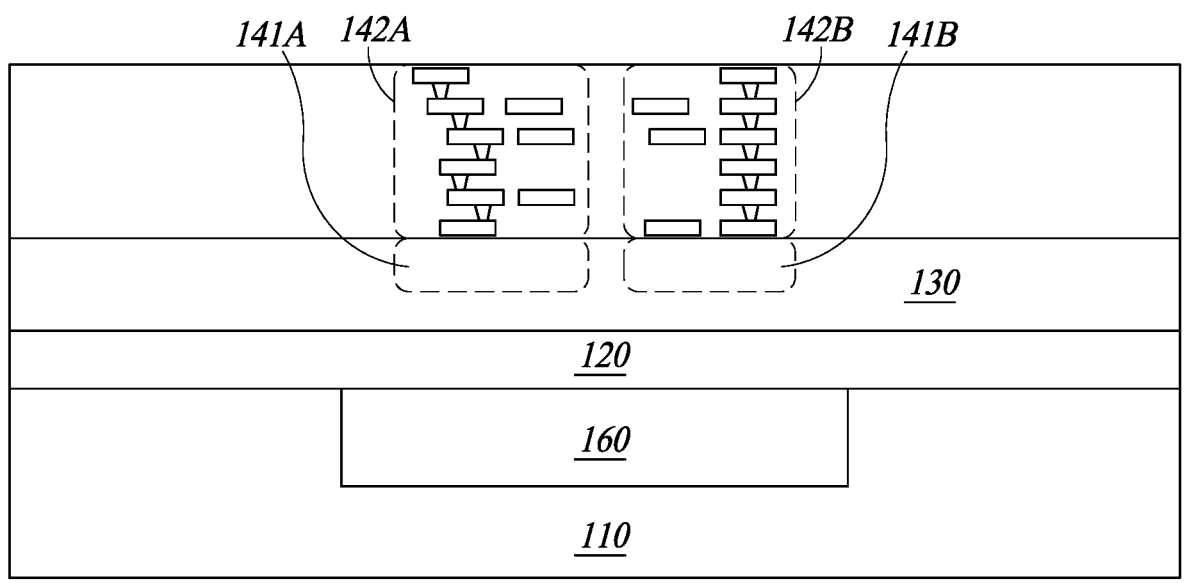

In FIG. 3C, following formation of the electrical devices 141A, 141B, internal interconnect structures 142A, 142B are formed over and electrically connected to the electrical devices 141A, 141B, corresponding to operation 410 of process 42 shown in FIG. 4. Formation of the interconnect structures 142A, 142B may include formation of dielectric layers, and formation of conductive traces, vias or both in the dielectric layers. Formation of the interconnect structures 142A, 142B may include formation of passive devices that include conductive electrodes, dielectric regions, or both. The passive devices may include capacitors, inductors and resistors.

Figure 3D:
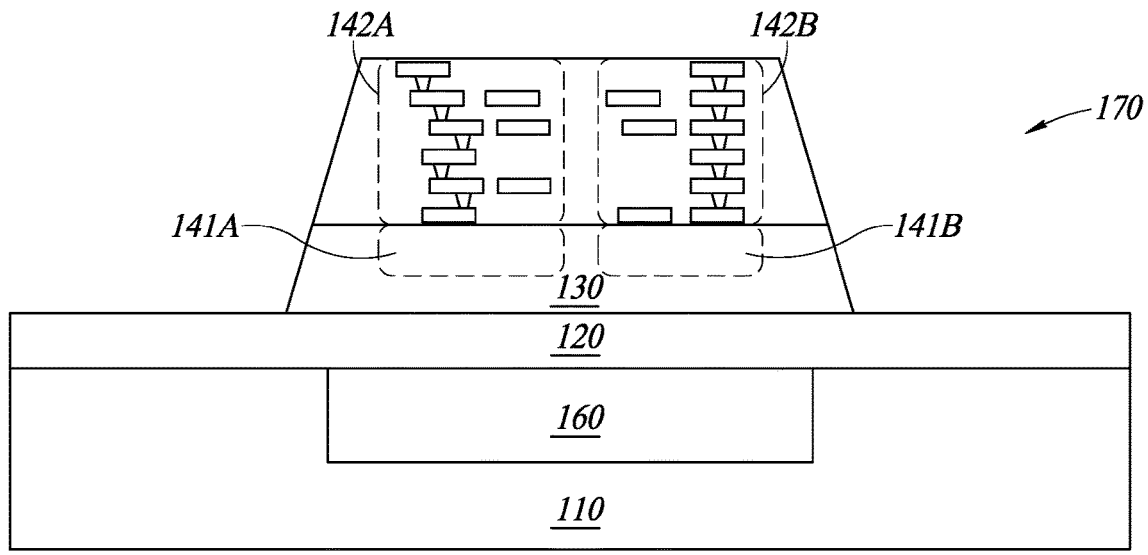
Figure 3E:
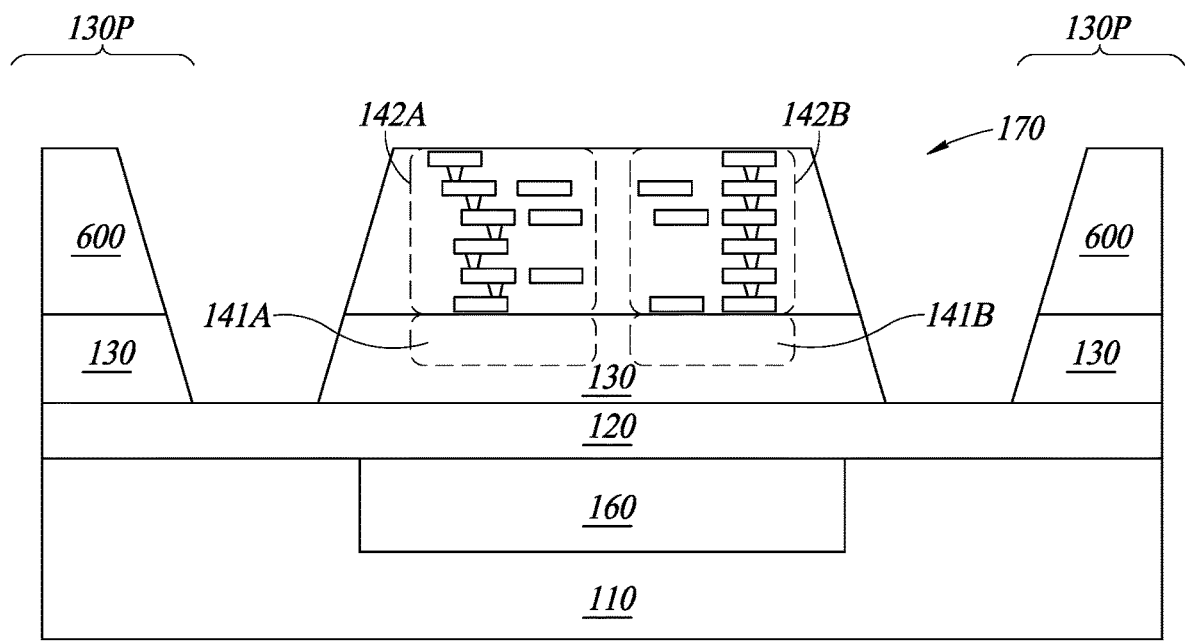

In FIGS. 3D and 3E, following formation of the interconnect structures 142A, 142B, the opening (or isolation region) 170 is formed in the second substrate 130 laterally surrounding the electrical devices 141A, 141B, corresponding to operation 420 of process 42 shown in FIG. 4. In FIG. 3D, the opening 170 is formed by removing the second substrate 130 to the outer edges of the structure. In FIG. 3E, the opening 170 is formed as a trench, such that the peripheral region 130P remains. The opening 170 may be formed by an etching operation. The etching operation may include one or more of a wet etch, a dry or plasma etch, a reactive ion etch, an ion bombardment, or the like. The opening 170 may expose the insulating layer 120. In some embodiments, the etching operation that forms the opening 170 is stopped prior to reaching the insulating layer 120, resulting in the second substrate 130 shown in FIG. 1E. The etching operation that forms the opening 170 may form tapered or angled sidewalls of the device region 100, as shown in FIGS. 3D and 3E.

As shown in FIG. 3E, a dielectric layer 600 may be present over the second substrate 130 in the peripheral region 130P. The dielectric layer 600 may be a multilayer structure including the same or about the same number of dielectric layers as are present in the interconnect structures 142A, 142B.

Figure 3F:
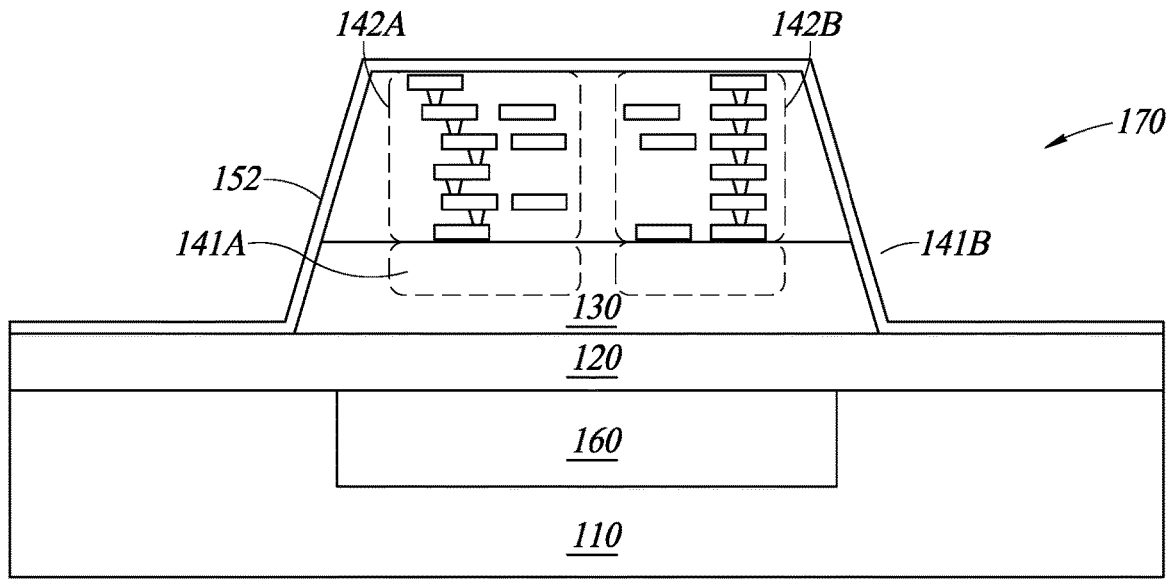
Figure 3G:
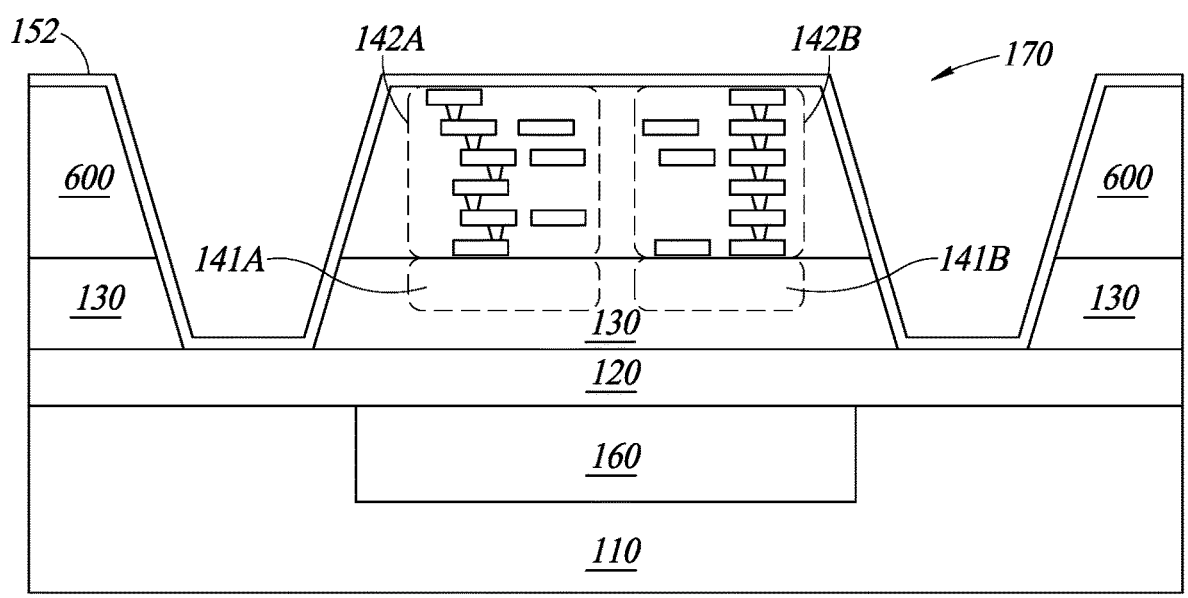

In FIGS. 3F and 3G, following formation of the opening 170, the passivation layer 152 may be formed. In some embodiments, the passivation layer 152 is formed over the device region 100 and the insulating layer 120, as shown. In some embodiments, the passivation layer 152 is formed selectively on the device region 100 and not on the insulating layer 120, as shown in FIG. 1B. The passivation layer 152 may be formed by deposition (e.g., chemical vapor deposition, physical vapor deposition, atomic layer deposition, or the like), thermal oxidation, spin coating, or other suitable operation. In some embodiments, the passivation layer 152 is not formed.

Figure 3H:
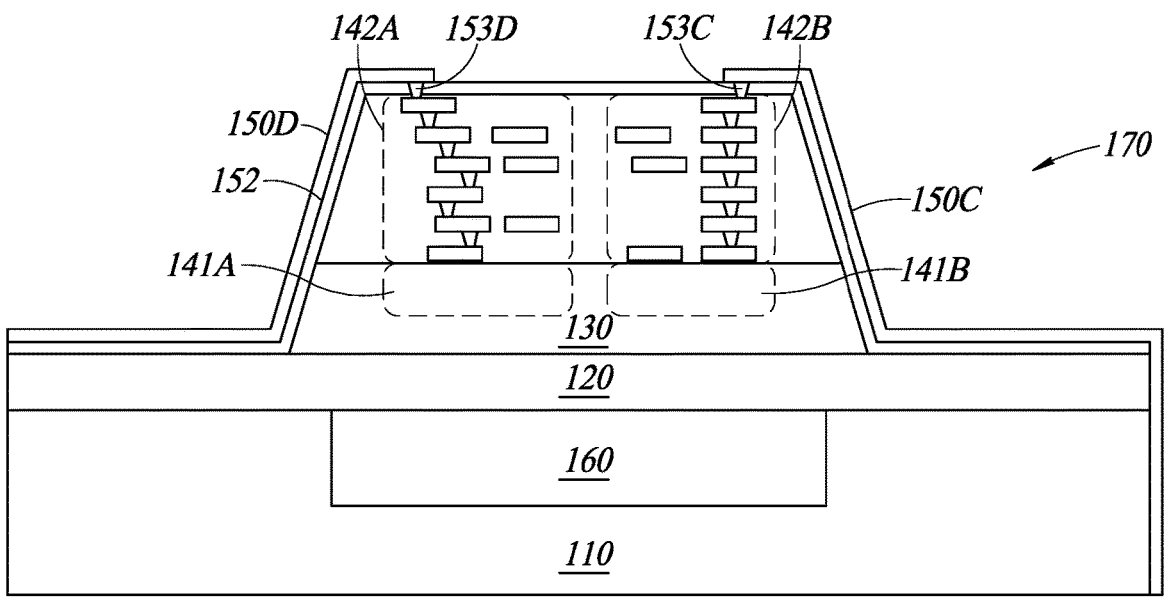
Figure 3I:
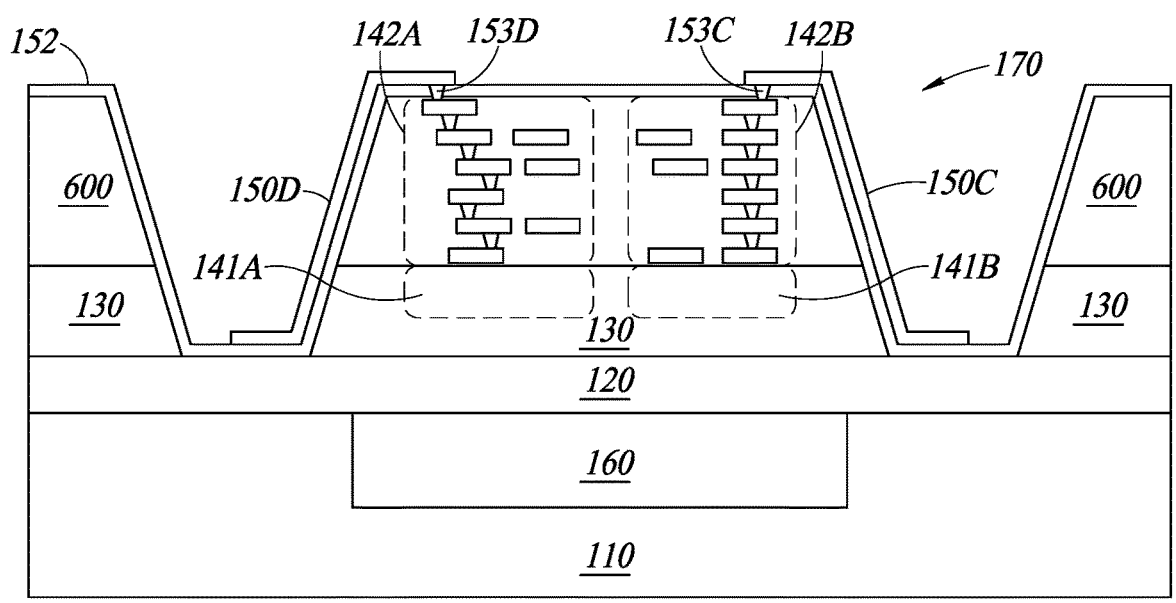

In FIGS. 3H and 3I, following optional formation of the passivation layer 152, conductive traces 150C, 150D (or "external interconnect structures 150C, 150D") are formed in the opening 170, corresponding to operation 440 of process 42 shown in FIG. 4. Formation of the conductive traces 150C, 150D may include deposition of a dielectric or passivation layer (not shown), patterning of the dielectric or passivation layer to form recesses, and deposition of conductive material (e.g., copper, tin, aluminum, or the like) in the recesses. Deposition of the conductive material may include chemical vapor deposition (CVD), physical vapor deposition (PVD), atomic layer deposition (ALD), electroplating or another suitable deposition operation. Due to the tapered or angled sidewalls of the device region 100, the peripheral region 130P, or both, the deposition of the conductive material may have improved uniformity.

Figure 3J:
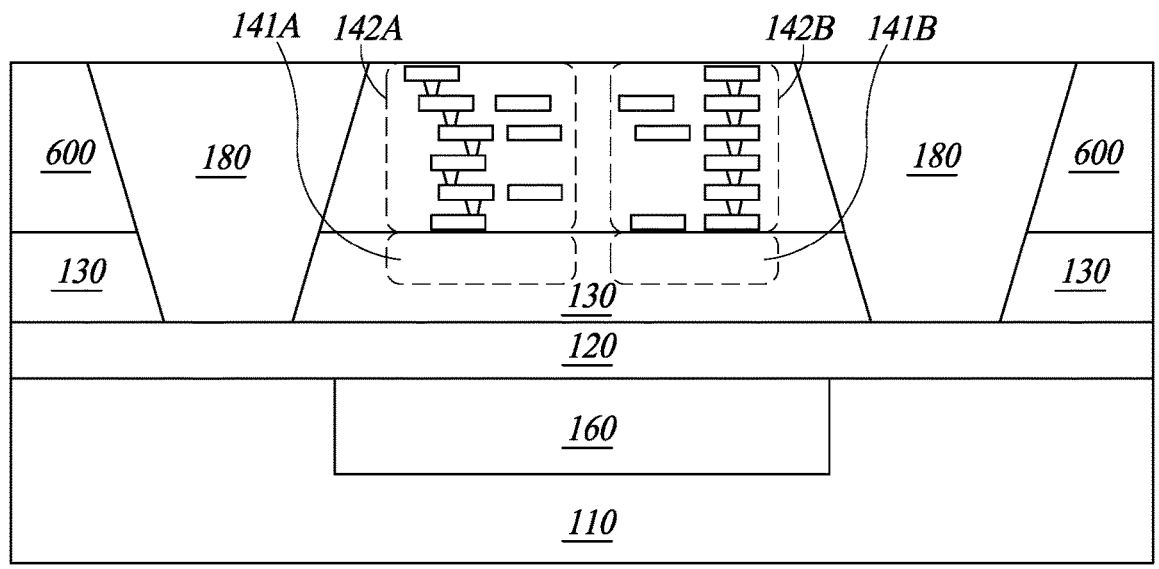

In FIG. 3J, the insulating material layer 180 is formed in the opening 170, corresponding to optional operation 430 of process 42 shown in FIG. 4. The insulating material layer 180 may be formed by a suitable deposition operation, such as a PVD, CVD, ALD, spin on, or the like. In some embodiments, the insulating material layer 180 fills the opening. It should be understood that "fills" includes partially fills or fully fills the opening. Following deposition of material of the insulating material layer 180, excess material of the insulating material layer 180 may be removed by a wet etch, a chemical mechanical planarization (CMP), a grinding, a combination thereof, or the like. Following the removal, upper surfaces of the insulating material layer 180 may be coplanar with or substantially coplanar with upper surfaces of the integrated circuits 140A, 140B and the dielectric layer 600.

Figure 3K:
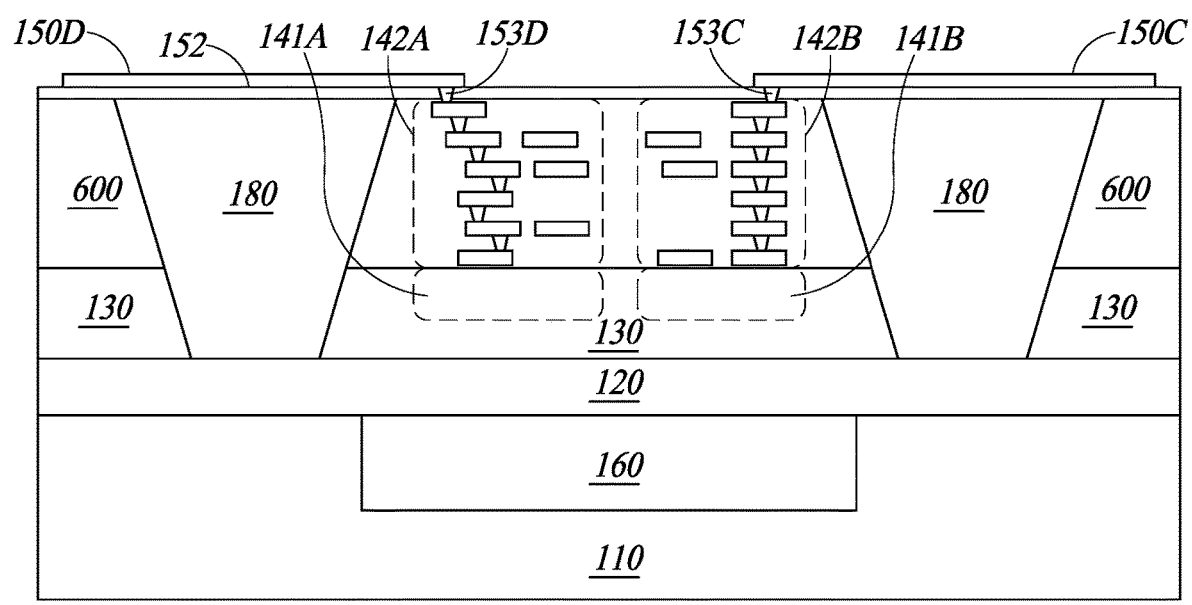

In FIG. 3K, following formation of the insulating material layer 180, the optional passivation layer 152 may be formed, followed by formation of the conductive tracks 150C, 150D, corresponding to operation 440 of process 42 shown in FIG. 4. Formation of the conductive traces 150C, 150D may include deposition of a dielectric or passivation layer (not shown), patterning of the dielectric or passivation layer to form recesses, and deposition of conductive material (e.g., copper, tin, aluminum, or the like) in the recesses. Deposition of the conductive material may include chemical vapor deposition (CVD), physical vapor deposition (PVD), atomic layer deposition (ALD), electroplating or another suitable deposition operation. Due to the upper surfaces of the device region 100, the peripheral region 130P and the insulating material layer 180 being coplanar or substantially coplanar, the deposition of the conductive material may have improved uniformity.

Figure 5:
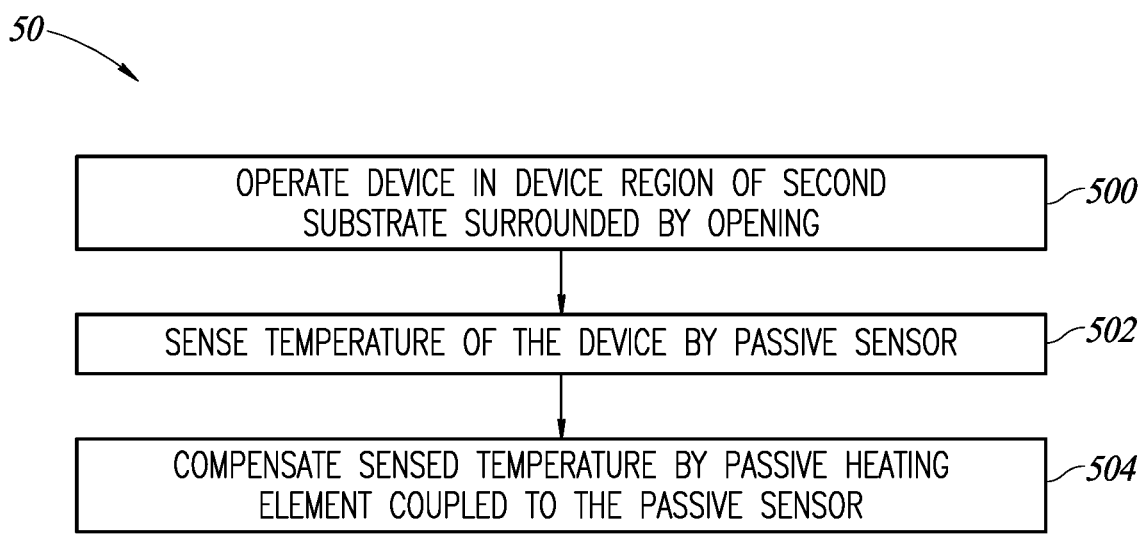
FIG. 5 is a flowchart of a method of passive control of a device in accordance with various embodiments disclosed herein.

FIG. 5 is a flowchart of a method 50 of passive thermal control and compensation of a device in accordance with various embodiments disclosed herein. The method 50 may be used in the integrated circuits 140A, 140B of FIGS. 1A-1G and the passive thermal control and compensation circuitry 600, 600A, 700, 700A of FIGS. 1I-1L. It should be understood that the method 50 may be utilized with integrated circuits, devices, and thermal control and compensation circuitry different from those shown in FIGS. 1A-1L. In some embodiments, the method 50 includes a number of operations (500, 502, 504). The method 50 will be further described according to one or more embodiments. It should be noted that the operations of the method 50 may be rearranged or otherwise modified within the scope of the various aspects. It should further be noted that additional processes may be provided before, during, and after the method 50, and that some other processes may be only briefly described herein. For example, operations 502 and 504 of the method 50 may be performed simultaneously by a single circuit element, such as by the thermistor 723 or RTD 723A of the passive thermal control and compensation circuitry 700, 700A.

In operation 500, a device (e.g., the integrated circuit 140A) is operated. The device is positioned in a device region (e.g., the device region 100) of a second substrate (e.g., the second substrate 130). The device region is surrounded by an opening (e.g., the opening 170). In some embodiments, as illustrated in FIG. 1E, the opening 170 may extend partially through the second substrate 130. Operating the device in operation 500 may include the device being powered on. Operating the device may include performing electrical or electronic functions associated with the integrated circuit.

In operation 502, temperature of the device is sensed by a passive sensor. In some embodiments, the passive sensor is a resistor, a thermistor, an RTD, or the like. The passive sensor may have a temperature coefficient of resistivity, such as a positive temperature coefficient of resistivity, in which the resistance of one or more components of the passive sensor changes with a change of temperature of the device.

In operation 504, a sensed temperature of the device is compensated by a passive heating element coupled to the passive sensor. For example, the passive heating element may be the resistor 623 of the heater 620, 620A shown in FIGS. 1I, 1J. In some embodiments, the passive heating element is the thermistor 723 or the RTD 723A of FIGS. 1K, 1L. In some embodiments, the compensation heats or cools (e.g., indirectly cools) the device. For example, as described with reference to FIGS. 1H-1L, current flow through the passive heating element may be increased in response to a decrease in the sensed temperature of the device, leading to heating of the device. In another example, current flow through the passive heating element may be decreased in response to an increase in the sensed temperature of the device, leading to cooling of the device. The cooling of the device may be indirect, for example, due to the device being operated at a higher temperature than its surroundings. As such, the device loses heat even if the device is isolated when the current flow through the passive heating element is reduced or removed. For example, the device may be operated at a temperature controlled at about 60° C. In such an example, if the temperature of the surroundings of the device is about 30° C., the temperature of the device may approach the temperature of the surroundings unless heated to maintain the about 60° C. setpoint, e.g., by the passive heating element. If the temperature of the device exceeds 60° C., the passive thermal control and compensation circuitry 600, 600A, 700, 700A, may allow the device to cool by reducing power (e.g., current flow) to the passive heating element, which allows heat energy to move passively from the device to the environment and thereby cool the device back to the 60° C. setpoint.

In some embodiments, the opening 170 extends partially through the second substrate 130. A portion of the second substrate 130 remaining in the opening 170 may provide thermal conductivity and act as a heat sink to absorb sharp thermal differentials in the device. The heat sinking provided by the remaining portion of the second substrate 130 may occur in conjunction with the passive dissipation of heat energy that occurs when the heating element is no longer heating the device.

The following examples illustrate a variety of ways in which aspects and features described above may be combined and achieve technical advantages of the present disclosure.

As one example, a structure described herein includes a first substrate, a second substrate having a device region therein, an insulating layer between the first substrate and the second substrate, and an opening in the second substrate. The opening surrounds the device region, extends through the second substrate, and exposes the insulating layer. The structure further includes an electrical device positioned in the device region of the second substrate, and a conductive track on a sidewall of the second substrate exposed by the opening. The conductive track is in electrical communication with the electrical device.

The structure in the preceding example may further include a cavity in the first substrate. The cavity is beneath the device region, with the device region being separated from the cavity by the insulating layer.

The conductive track in any of the preceding examples may extend from the electrical device across an exposed region of the insulating layer and onto a sidewall of the first substrate.

The structure in any of the preceding examples may further include thermal control and compensation circuitry in the device region. In operation, the thermal control and compensation circuitry adjusts a temperature of the electrical device in response to a temperature-dependent electrical characteristic of the electrical device.

In any of the preceding examples, the thermal control and compensation circuitry may include a heating element, a sensing element, and an amplifier electrically connected to the heating element and the sensing element. In operation, the amplifier adjusts electrical current in the heating element in response to a temperature-dependent change in voltage across the sensing element.

In any of the preceding examples, the thermal control and compensation circuitry may be active or passive thermal control and compensation circuitry. The thermal control and compensation circuitry includes a power supply and a heater. The heater includes a sensing element and a heating element. The heating element may be a resistor, thermistor or RTD.

In any of the preceding examples, a surface of the conductive track facing the insulating layer may be substantially coplanar with a surface of the second substrate facing the insulating layer.

The structure in any of the preceding examples may further include a passivation layer on sidewalls of the second substrate. The conductive track is separated from the second substrate by the passivation layer.

In any of the preceding examples, the electrical device positioned in the device region of the second substrate is a first electrical device. The second substrate has a second electrical device arranged thereon, the second electrical device being separated from the first electrical device by the opening. The conductive track is in electrical communication with the second electrical device.

As another example, a structure described herein includes a first substrate, a second substrate including a device region and a peripheral region laterally surrounding the device region, and an insulating layer between the first substrate and the second substrate. An opening laterally surrounds the device region and separates the device region from the peripheral region. The opening extends into the second substrate. The structure also includes an electrical device in the device region, and a conductive track in electrical communication with the electrical device, the conductive track being positioned in the opening and the peripheral region.

The structure in the preceding example may further includes at least one of a thermally insulating material layer in the opening or an electrically insulating material layer in the opening. The conductive track is on the thermally insulating material layer or on the electrically insulating material layer.

In any of the preceding examples, an upper surface of the thermally insulating material layer may be substantially coplanar with an upper surface of the second substrate, or an upper surface of the electrically insulating material layer may be substantially coplanar with an upper surface of the second substrate.

The structure in any of the preceding examples may further include thermal control and compensation circuitry in the device region. In operation, the thermal control and compensation circuitry automatically adjusts a temperature of the electrical device in response to a temperature-dependent electrical characteristic of the electrical device.

In any of the preceding examples, the thermal control and compensation circuitry may include a resistive heating element, a sensor diode, a comparator having a first input coupled to the sensor diode, an output coupled to the resistive heating element, and a second input. The circuitry may further include feedback circuitry that is coupled between the second input and the output, and bias circuitry coupled to the second input.

The structure in any of the preceding examples may further include a third substrate that is bonded to the second substrate, with the surface of the second substrate facing away from the first substrate. Each of the first substrate and the third substrate includes a cavity that is overlapping or underlapping the opening.

In any of the preceding examples, the sidewalls of the opening may be tapered with respect to a major surface of the insulating layer. Furthermore, the opening extends partially into the second substrate such that the second substrate is between the opening and the insulating layer.

In any of the preceding examples, the structure may be a device or system, or may be a component of the device or system.

As another example, a method described herein may include positioning an electrical device in a device region of a second substrate. The device region overlies an insulating layer, and the insulating layer is on a first substrate. The method further includes forming an isolation region in the second substrate. The isolation region surrounding the electrical device, wherein forming the isolation region produces sidewalls of the second substrate extending upward from the insulating layer at a tapered angle less than 90 degrees.

Lastly, the method includes forming a conductive track in the isolation region. The conductive track is in electrical communication with the electrical device. Forming an isolation region may include forming an opening laterally surrounding the electrical device, with the opening exposing the insulating layer.

Forming a conductive track may include forming the conductive track on a surface of the insulating layer. The surface of the insulating layer is exposed by the opening.

In any of the preceding examples, the method may further include depositing, in the opening, at least one of a thermally-insulating material layer or an electrically-insulating material layer.

The example method further includes forming a conductive track. The conductive track is formed on an upper surface of the thermally-insulating material layer, or is formed on an upper surface of the electrically-insulating material layer.

As another example, a method described herein may include operating a device in a device region of a second substrate that is surrounded by an opening. The device region overlies an insulating layer, and the insulating layer is on a first substrate. The method further includes sensing temperature of the device by a passive sensor, such as the sensing element of the passive thermal control and compensation circuitry. The method further includes compensating a sensed temperature of the device by a heating element coupled to the passive sensor.

Compensating a sensed temperature may include compensating the sensed temperature by a resistor, thermistor, or RTD.

Aspects of the various embodiments described above can be combined to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A structure for a temperature regulated electrical device, the structure comprising:
    a first substrate;
    a second substrate having a device region therein;
    an insulating layer beneath the device region between the first substrate and the device region of the second substrate;
    an opening extending into the second substrate, the opening completely surrounding a perimeter of the device region and the insulating layer extending across the device region from a first side of the device region to a second side of the device region;
    an electrical device positioned in the device region of the second substrate; and
    a conductive track on a sidewall of the second substrate exposed by the opening, the conductive track being in electrical communication with the electrical device.

2. The structure of claim 1, wherein the first substrate includes a cavity, the cavity being beneath the device region, and the device region being separated from the cavity by the insulating layer.

3. The structure of claim 1, wherein the conductive track extends from the electrical device across an exposed region of the insulating layer and onto a sidewall of the first substrate.

4. The structure of claim 1, further comprising:
thermal control and compensation circuitry in the device region, wherein the thermal control and compensation circuitry, in operation, adjusts a temperature of the electrical device in response to a temperature-dependent electrical characteristic of the electrical device.

5. The structure of claim 4, wherein the thermal control and compensation circuitry includes:
a power supply; and
a heater coupled to the power supply;
wherein the heater includes a resistor, a thermistor, a resistance temperature detector, or a combination thereof.

6. The structure of claim 1, further comprising:
a passivation layer on the sidewall of the second substrate, the conductive track being separated from the second substrate by the passivation layer.

7. The structure of claim 1, wherein the electrical device positioned in the device region of the second substrate is a first electrical device, and wherein the second substrate has a second electrical device arranged thereon, the second electrical device being separated from the first electrical device by the opening, and a conductive track in electrical communication with the second electrical device.

8. The structure of claim 1, wherein at least a portion of the second substrate separates the electrical device from the insulating layer.

9. A system for a temperature regulated electrical device, the system comprising:
an electrical device; and
a structure comprised of:
a first substrate;
a second substrate including:
a device region; and
a peripheral region laterally surrounding the device region;
an insulating layer beneath the device region and extending across the device region between the first substrate and the device region of the second substrate, wherein at least a portion of the second substrate separates the electrical device from the insulating layer;
an opening laterally surrounding the device region and separating the device region from the peripheral region, the opening extending into the second substrate; and
a conductive track in electrical communication with the electrical device, the electrical device being positioned in the device region of the second substrate, and the conductive track being positioned in the opening and the peripheral region.

10. The system of claim 9, wherein the structure is further comprised of at least one of a thermally insulating material layer in the opening or an electrically insulating material layer in the opening,
wherein the conductive track is on the thermally insulating material layer or on the electrically insulating material layer.

11. The system of claim 10, wherein:
an upper surface of the thermally insulating material layer is substantially coplanar with an upper surface of the second substrate; or
an upper surface of the electrically insulating material layer is substantially coplanar with an upper surface of the second substrate.

12. The system of claim 9, wherein the structure is further comprised of:
thermal control and compensation circuitry in the device region, wherein the thermal control and compensation circuitry, in operation, automatically adjusts a temperature of the electrical device in response to a temperature-dependent electrical characteristic of the electrical device.

13. The system of claim 12, wherein the thermal control and compensation circuitry includes:
a resistive heating element;
a sensor diode;
a comparator having:
a first input coupled to the sensor diode;
an output coupled to the resistive heating element; and
a second input;
feedback circuitry coupled between the second input and the output; and
bias circuitry coupled to the second input.

14. The system of claim 9, wherein the structure is further comprised of:
a third substrate, the third substrate being bonded to the second substrate, and a surface of the second substrate facing away from the first substrate;
wherein each of the first substrate and the third substrate includes a cavity, the cavity overlapping or underlapping the opening.

15. The system of claim 9, wherein sidewalls of the opening are tapered with respect to a major surface of the insulating layer.

16. The system of claim 9, wherein the opening extends partially into the second substrate, such that the second substrate is between the opening and the insulating layer.

17. A method for forming a temperature regulated electrical device, the method comprising:
positioning an electrical device in a device region of a second substrate, the device region overlying an insulating layer, the insulating layer being on a first substrate between the first substrate and the device region;
forming an isolation region in the second substrate, the isolation region laterally surrounding the device region and isolating the device region from laterally adjacent structure, wherein the forming the isolation region produces sidewalls of the second substrate extending upward from the insulating layer at a tapered angle less than 90 degrees, and the insulating layer extends across the device region between the sidewalls of the second substrate; and
forming a conductive track in the isolation region, the conductive track being in electrical communication with the electrical device.

18. The method of claim 17, wherein the forming an isolation region includes:
forming an opening laterally surrounding a perimeter of the device region, the opening exposing the insulating layer.

19. The method of claim 18, wherein the forming a conductive track includes:
forming the conductive track on a surface of the insulating layer, the surface of the insulating layer being exposed by the opening.

20. The method of claim 18, further comprising:
depositing, in the opening, at least one of:
a thermally-insulating material layer; or
an electrically-insulating material layer.

21. The method of claim 20, wherein the forming a conductive track includes:
- forming the conductive track on an upper surface of the thermally-insulating material layer; or
- forming the conductive track on an upper surface of the electrically-insulating material layer.

\* \* \* \* \*